(12) United States Patent
Dale et al.

(10) Patent No.: US 9,568,580 B2
(45) Date of Patent: Feb. 14, 2017

(54) IDENTIFYING WHITE MATTER FIBER TRACTS USING MAGNETIC RESONANCE IMAGING (MRI)

(75) Inventors: Anders M. Dale, La Jolla, CA (US); Donald J. Hagler, Jr., Chula Vista, CA (US)

(73) Assignee: The Regents Of The University Of California, Oakland, CA (US)

( * ) Notice: Subject to any disclaimer, the term of this patent is extended or adjusted under 35 U.S.C. 154(b) by 1101 days.

(21) Appl. No.: 12/496,441

(22) Filed: Jul. 1, 2009

(65) Prior Publication Data

US 2010/0004527 A1    Jan. 7, 2010

Related U.S. Application Data

(60) Provisional application No. 61/077,335, filed on Jul. 1, 2008.

(51) Int. Cl.
*A61B 5/05* (2006.01)
*G01R 33/563* (2006.01)
*G01R 33/56* (2006.01)

(52) U.S. Cl.
CPC ..... *G01R 33/56341* (2013.01); *G01R 33/5602* (2013.01); *G01R 33/5608* (2013.01)

(58) Field of Classification Search
USPC ........................................ 600/410, 415, 416
See application file for complete search history.

(56) References Cited

U.S. PATENT DOCUMENTS 6,130,958 A    10/2000 Rohler et al.
6,587,707 B2    7/2003 Nehrke et al.
(Continued)

FOREIGN PATENT DOCUMENTS

JP    2004089224 A    3/2004
JP    2005525206 A    8/2005
(Continued)

OTHER PUBLICATIONS

Cook et al., "Atlas-guided probabilistic diffusion-tensor fiber tractography", IEEE International Symposium on Biomedical Imaging: From Nano to Macro, May 14, 2008-May 17, 2008, Paris, France, pp. 951-954.*

(Continued)

*Primary Examiner* — Christopher Cook
(74) *Attorney, Agent, or Firm* — Perkins Coie LLP

(57) ABSTRACT

Systems, methods, and software are used for identifying fibers based at least in part on magnetic resonance imaging. A fiber tract atlas for a nervous system includes atlas voxels that each represent a different volume element of the nervous system; a first atlas voxel represents a first volume element of the nervous system. The fiber tract atlas also includes information on orientations of a first fiber tract in the first volume element of the nervous system. Magnetic resonance data is acquired from the nervous system of a subject. The magnetic resonance data includes data voxels; a first data voxel relates to the first atlas voxel. A diffusion vector is generated for the first data voxel based at least in part on the acquired magnetic resonance data. The fiber tract atlas is used to find a probability that the first data voxel represents the first fiber tract based at least in part on the generated diffusion vector and the information on the orientations of the first fiber tract in the first volume element.

21 Claims, 15 Drawing Sheets

(56) References Cited

U.S. PATENT DOCUMENTS

| | | | |
|---|---|---|---|
| 6,771,068 | B2 | 8/2004 | Dale et al. |
| 6,952,097 | B2 | 10/2005 | Schreck et al. |
| 6,958,605 | B2 | 10/2005 | Dale et al. |
| 7,022,077 | B2 | 4/2006 | Mourad et al. |
| 7,324,842 | B2 | 1/2008 | Dale et al. |
| 7,358,732 | B2 | 4/2008 | Van Der Kouwe et al. |
| 8,126,291 | B2 | 2/2012 | Paragios et al. |
| 8,170,305 | B2 * | 5/2012 | Laidlaw et al. ............ 382/128 |
| 2003/0065535 | A1 * | 4/2003 | Karlov et al. ............... 705/2 |
| 2003/0118227 | A1 | 6/2003 | Winsor et al. |
| 2004/0113615 | A1 | 6/2004 | Bammer et al. |
| 2005/0107808 | A1 | 5/2005 | Evans et al. |
| 2005/0143634 | A1 | 6/2005 | Baker et al. |
| 2006/0001424 | A1 | 1/2006 | Harvey et al. |
| 2007/0081706 | A1 | 4/2007 | Zhou et al. |
| 2007/0122018 | A1 | 5/2007 | Zhou et al. |
| 2007/0253599 | A1 | 11/2007 | White et al. |
| 2008/0069446 | A1 | 3/2008 | Ancelin |
| 2008/0154118 | A1 | 6/2008 | Dale et al. |
| 2008/0285835 | A1 | 11/2008 | Holland et al. |
| 2012/0288171 | A1 | 11/2012 | Beymer et al. |

FOREIGN PATENT DOCUMENTS

| | | |
|---|---|---|
| JP | 2006524088 A | 10/2006 |
| JP | 2007275312 A | 10/2007 |
| WO | 2008054947 A2 | 5/2008 |
| WO | WO 2009/065079 | 5/2009 |

OTHER PUBLICATIONS

Burgel et al., "White matter fiber tracts of the human brain: Three-dimensional mapping at microscopic resolution topography and intersubject variability", NeuroImage 29, 2006, pp. 1092-1105.*

Lin et al., "Diffusion tensor tractography-based group mapping of they Pyramidal tract in relapsing-remitting multiple sclerosis patients", AJNR 28, 2007, pp. 278-282.*

Jellison et al., "Diffusion Tensor Imaging of Cerebral White Matter: A pictorial review of Physics, Fiber tract anatomy, and Tumor Imaging Patterns" AJNR, 25, 2004, pp. 356-369.*

Corouge et al., "Fiber tract-oriented statistics for quantitative diffusion tensor MRI analysis", Medical Image Analysis, available online Aug. 22, 2006.*

Masutani et al., "Model-Based Tractography Based on Statistical Atlas of MR-DTI", IEEE, 2006.*

Dinov, Ivo, "Applied Probability & Statistics for Engineers: Joint Probability Distribution and Random Samples", UCLA, spring 2004.*

Cook et al., "Camino: Open-Source Diffusion-MRI Reconstruction and Processing", Proc. Intl. Soc. Mag. Reson. Med., 14, 2006.*

Shattuck et al., "Construction of a 3D Probablistic Atlasof Human Cortial Structures", Neuroimage, Feb. 1, 2008.*

Basser, P.J. et al., "MR diffusion *tensor* spectroscopy and imaging," Biophysical Journal 66(1):259-267 (Jan. 1994).

Basser, P. J. et al., "In vivo fiber tractography using DT-MRI data," Magnetic Resonance in Medicine 44(4):625-632 (2000).

Behrens, T. E. J., "Probabilistic diffusion tractography with multiple fibre orientations: What can we gain?," NeuroImage 34(1):144-155 (2007).

Behrens, T. E. J., "Characterization and propagation of uncertainty in diffusion-weighted MR imaging," Magnetic Resonance in Medicine 50(5):1077-1088 (2003).

Berman, J.I.,. "Accuracy of diffusion tensor magnetic resonance imaging tractography assessed using intraoperative subcortical stimulation mapping and magnetic source imaging," J Neurosurg. 107(3): 488-494 (2007).

Berman, J. I., "Probabilistic streamline $q$-ball tractography using the residual bootstrap," NeuroImage 39(1): 215-222 (Jan. 2008, published online Aug. 2007).

Bernasconi, N. et al., "Mesial temporal damage in temporal lobe epilepsy: a volumetric MRI study of the hippocampus, amygdala and parahippocampal region," Brain 126(Pt 2):462-469 (2003).

Bonilha, L et al., "Extrahippocampal gray matter atrophy and memory impairment in patients with medial temporal lobe epilepsy," Human Brain Mapping 28(12):1376-1390 (2007).

Catani, M., et al., "Virtual in vivo interactive dissection of white matter fasciculi in the human brain," NeuroImage 17(1):77-94 (2002).

Chang, H. and J.M. Fitzpatrick, "A technique for accurate magnetic resonance imaging in the presence of field inhomogeneities," IEEE Transactions on Medical Imaging 11(3):319-329 (Sep. 1992).

Clayden, J. D. et al., "Improved segmentation reproducibility in group tractography using a quantitative tract similarity measure," NeuroImage 33(2):482-492 (2006).

Clayden, J. D. et al., "A probabilistic model-based approach to consistent white matter tract segmentation," IEEE Transactions on Medical Imaging 26(11):1555-1561 (Nov. 2007).

Conturo, T.E. et al., "Tracking neuronal fiber pathways in the living human brain," Proc. Natl. Acad. Sci. USA 96(18):10422-10427 (Aug. 1999).

Fischl, B. et al., "Whole brain segmentation: automated labeling of neuroanatomical structures in the human brain," Neuron 33(3):341-355 (Jan. 31, 2002).

Frank, L.R., "Characterization of anisotropy in high angular resolution diffusion-weighted MRI," Magnetic Resonance in Medicine 47(6):1083-1099 (2002).

Friman, O. et al., "A Bayesian approach for stochastic white matter tractographym," IEEE Transactions on Medical Imaging 25(8):965-978 (Aug. 2006).

Friston, K.J. et al., "Spatial registration and normalization of images," Human Brain Mapping 2:165-189 (1995).

Genovese, C.R. et al., "Thresholding of statistical maps in functional neuroimaging using the false discovery rate," NeuroImage 15(4):870-878 (2002).

Hagler, Jr., D. J. et al., "Automated white-matter tractography using a probabilistic diffusion tensor atlas: Application to temporal lobe epilepsy," Human Brain Mapping, 30(5):1535-1547 (2009, published online Jul. 31, 2008).

Hua, K. et al., "Tract probability maps in stereotaxic spaces: Analyses of white matter anatomy and tract-specific quantification," Neuroimage 39(1):336-347 (Jan. 2008, published online Aug. 2007).

Jansons, K. M. and D.C. Alexander, "Persistent Angular Structure: new insights from diffusion MRI data. Dummy version," Proceedings of the Information Processing in Medical Imaging, 18$^{th}$ International Conference, IPMI 2003, LNCS 2732, Ambleside, UK, Jul. 20-25, 2003, C. Taylor and J. A. Noble (Eds.), 18: 672-683 (2003).

Jones, D.K. and C. Pierpaoli, "Confidence mapping in diffusion tensor magnetic resonance imaging tractography using a bootstrap approach," Magnetic Resonance in Medicine 53(5):1143-1149 (2005).

Jovicich, J. et al., "Reliability in multi-site structural MRI studies: Effects of gradient non-linearity correction on phantom and human data," Neuroimage 30(2):436-443 (2006).

Keller, S.S. et al, "Voxel-based morphometric comparison of hippocampal and extrahippocampal abnormalities in patients with left and right hippocampal atrophy," Neuroimage 16(1):23-31 (2002).

Lawes, I.N. et al., "Atlas-based segmentation of white matter tracts of the human brain using diffusion tensor tractography and comparison with classical dissection," NeuroImage 39(1):62-79 (Jan. 2008, published online Aug. 2007).

Lazar M. and A.L. Alexander, "Bootstrap white matter tractography (BOOT-TRAC)," NeuroImage 24(2):524-32 (2005).

Leventon, M.E. and W.E.L. Grimson, "Multi-modal volume registration using joint intensity distributions," Proceedings of the International Conference on Medical Image Computing and Computer-Assisted Interventation—MIMCCAI'98, vol. 1496, pp. 1057-1066 (1998).

Maddah, M. et al., "Automated atlas-based clustering of white matter fiber tracts from DTMRI," Proceedings of the International Conference on Medical Image Computing and Computer-Assisted Interventation—MIMCCAI'05, vol. 8(Pt 1):188-195 (2005).

(56) References Cited

OTHER PUBLICATIONS

Morgan, P.S. et al., "Correction of spatial distortion in EPI due to inhomogeneous static magnetic fields using the reversed gradient method," Journal of Magnetic Resonance Imaging 19(4): 499-507 (2004).
Mori, S. et al., "Three-dimensional tracking of axonal projections in the brain by magnetic resonance imaging," Ann. Neurol. 45:265-269 (1999).
Mori, S. et al., "Imaging cortical association tracts in the human brain using diffusion-tensor-based axonal tracking," Magnetic Resonance in Medicine 47(2):215-223 (2002).
O'Donnell, L. and C.-F. Westin, "High-dimensional white matter atlas generation and group analysis," Proceedings of the International Conference on Medical Image Computing and Computer-Assisted Intervention—MIMCCAI'06, vol. 9(Pt 2), pp. 243-251 (2006).
O'Donnell, L. J. et al., "Automatic tractography segmentation using a high-dimensional white matter atlas," IEEE Transactions on Medical Imaging 26(11):1562-1575 (2007).
Oldfield, R.C., "The assessment and analysis of handedness: the Edinburgh inventory," Neuropsychologia 9(1):97-113 (1971).
Park, H.-J. et al., Spatial normalization of diffusion tensor MRI using multiple channels,. NeuroImage 20(4):1995-2009 (2003).
Park, H.-J. et al., "Method for combining information from white matter fiber tracking and gray matter parcellation," AJNR Am J Neuroradiol 25(8):1318-1324 (Sep. 2004).
Parker, G. J. M. et al., "Initial demonstration of in vivo tracing of axonal projections in the macaque brain and comparison with the human brain using diffusion tensor imaging and fast marching tractography," NeuroImage 15(4):797-809 (2002).
Poupon, C. et al., "Regularization of diffusion-based direction maps for the tracking of brain white matter fascicles," NeuroImage 12(2):184-195 (2000).
Reinsberg, S.A. et al., "A complete distortion correction for MR images: II. Rectification of static-field inhomogeneities by similarity-based profile mapping," Phys. Med. Biol. 50(11):2651-2661 (2005).
Stieltjes, B. et al., "Diffusion tensor imaging and axonal tracking in the human brainstem," NeuroImage 14(3):723-735 (2001).
Tournier, J.-D. et al., "Direct estimation of the fiber orientation density function from diffusion-weighted MRI data using spherical deconvolution," NeuroImage 23(3):1176-1185 (2004).
Tuch, D.S., "Q-ball imaging," Magnetic Resonance in Medicine 52(6):1358-1372 (2004).
Wakana, S. et al., "Reproducibility of quantitative tractography methods applied to cerebral white matter," NeuroImage 36(3):630-644 (2007).
Wakana, S. et al., "Fiber tract-based atlas of human white matter anatomy," Radiology 230(1):77-87 (2004).
Xia, Y. et al., "Knowledge-based classification of neuronal fibers in entire brain," Proceedings of the International Conference on Medical Image Computing and Computer-Assisted Intervention—MIMCCAI'05, vol. 8(Pt 1): 205-212 (2005).
Yogarajah, M. and J.S. Duncan, "Diffusion-based magnetic resonance imaging and tractography in epilepsy," Epilepsia 49(2): 189-200 (Feb. 2008, published online Oct. 2007).
"Hidden Markov Model" Wikipedia, the free encyclopedia, <http://en.wikipedia.org/wiki/Hidden_Markov_model>, accessed on Apr. 12, 2006, 4 pages.
"Kalman Filter" Wikipedia, three free encyclopedia, <http://enlwikipedia.org/wiki/Kalman_filter>, accessed on Apr. 12, 2006, 15 pages.
"Motion Correction," Magnetic Resonance Research Laboratory, Mayo Clinic, <http://mayoresearch.mayo.edu/mayo/research/mri-lab/motion_correction.cfm>, accessed on Apr. 11, 2006, 3 pages.
"Recursive Bayesian estimation" Wikipedia, thre free encyclopedia, <http://en.wikipedia.org/wiki/Recursive_Bayesian_estimation>, accessed on Apr. 12, 2006, 3 pages.

Bernstein, M.A., et al., "Ringlet motion correction for 3D MRI acquired with the elliptical centric view order," Magn Reson Med, 50(4), 2003, pp. 802-812.
Christensen, G.E., et al., "Volumetric Transformation of Brain Anatomy", IEEE Trans on Med Imag., vol. 16, No. 6, Dec. 1997, p. 864.
Collins, D. L., et al., "An Automated 3D nonlinear deformation procedure for determination of gross morphometric variability in human brain", Proc. SPIE 2359, Visualization in Biomedical Computing 1994, p. 180.
Cook, P.A., et al., "An Automated Approach to Connectivity-Based Partitioning of Brain Structures", Medical Image Computing and Computer-Assisted Intervention—MIC CAI 2005 Lecture Notes in Computer Science, Jan. 1, 2005, pp. 164-171.
Costa, A.F., et al., "Using the axis of rotation of polar navigator echoes to rapidly measure 3D rigid-body motion", Magn Reson Med., 53(1), 2005, pp, 150-158.
Csernansky, J.G., et al., "Preclinical detection of Alzheimer's disease: hippocampal shape and volume predict dementia onset in the elderly", NeuroImage 25, 2005, pp. 783-792.
Derbyshire, J.A., et al., "Dynamic scan-plane tracking using MR position monitoring," J Magn Reson Imaging, 8(4), 1998, pp. 924-932.
Dietrich, O., et al., "Reducing motion artefacts in diffusion-weighed MRI of the brain: efficacy of navigator echo correction and pulse triggering", Neuroradiology, 42(2), 2000, pp. 85-91.
Ehman R.L., et al., "Adative Technique for High-Definition MR Imaging of Moving Structures", Radiology 173, 1989, pp. 255-263.
Ashburner, J., et al., "High-Dimensional Image Warping", Human Brain Function, Chapter 4, Second Ed. Elsevier, Academic Press, Amsterdam, Boston, pp. 1-31.
Freeborough, P.A., et al., "The Boundary Shift Integral: An Accurate and Robust Measure of Cerebral Volume Changes from Registered Repeat MRI", IEEE Trans. On Med Imag., 16(5), Oct. 1997, p. 623.
Fu, Z.W., et al., "Oribtal navigator echoes for motion measurements in magnetic resonance imaging", Magn Reson Med, 34(5), 1995, pp. 746-753.
Holland, D., et al., "Nonlinear registration of longitudinal images and measurement of change in regions of interest", Medical Image Analysis, 15, 2011, pp. 489-497.
Kadah, Y.M., et al., "Floating navigator echo (FNAV) for in-plane 2D translational motion estimation", Magn Reson Med, 51(2), 2004, pp. 403-407.
Knesaurek, K., et al., "A new iterative reconstruction technique for attenuation correction in high-resolution positron emission tomography", European Journal of Nuclear Medicine, 23(6), Jun. 1996, pp. 656-661.
Manduca, A., et al., "Autocorrection in MR Imaging: Adaptive Motion Correction without Navigator Echoes", Radiology, 215, 2000, pp. 904-909.
Masutani,Y., et al., "Building Statistical Atlas of White Matter Fiber Tract Based on Vector/Tensor Field Reconsitruction in Diffusion Tensor MRI", Advances in Visual Computing Lecture Notes in Computer Science, Jan. 1, 2005, pp. 84-91.
Mori, S., et al., "A motion correction scheme by twin-echo navigation for diffusion-weighted magnetic resonance imaging with multiple RF echo acquisition", Magn Reson Med, 40(4), 1998, pp. 511-516.
Moriguchi, H., et al., "Novel interleaved spiral imaging motion correction technique using orbital navigators", Magn Reson Med, 50(2), 2003, pp. 423-428.
Nehrke, K,. et al., "Prospective Correction of Affine Motion for Arbitrary MR Sequences on a Clinical Scanner", Magnet Resonance in Medicine, 54, 2005, pp. 1130-1138.
Nucifora, P., et al., "Diffusion-tensor MR imaging and tractography: Exploring brain microstructure and connectivity", Radiology, 245(2), Nov. 1, 2007, pp. 367-384.
Peshkovsky, A., et al., "Motion correction in MRI using an apparatus for dynamic angular position tracking (ADAPT)," Magn Reson Med, 49(1), 2003, pp. 138-143.
Sachs, T.S., et al., "Real-time motion detection in spiral MRI using navigators", Magn Reson Med, 32(5), 1994, pp. 639-645.

(56) References Cited

OTHER PUBLICATIONS

Scahill, R.I., et al., "Mapping the evolution of regional atrophy in Alzheimer's disease: Unbiased analysis of fluid-registered serial MRI," PNAS, 99(7), Apr. 2, 2002, pp. 4703-4707.
Shankaranarayanan, A., et al., "Motion Insensitive 3D Imaging Using a Novel Real-Time Image-Based 3D Prospective Motion Correction Method (3D Promo)", ISMRM 15th Scientific Meeting, Berlin, Germany, May 19-25, 2007, p. 2117.
Speck, O., et al., "Prospective reai-time slice-by-slice motion correction for fMRI in freely moving subjects", Mag Reson Mater Phy, 19, 2006, pp. 55-61.
Studholme, C., "Dense feature deformation morphometry: Incorporating DTE data into conventional MRI morphometry", Medical Image Analysis, 12(6), Apr. 16, 2008, pp. 742-751.
Thesen, S., et al., "Prospective Acquisition Correction for Head Motion with Image-Based Tracking for Real-Time fMRI" Magnetic Resonance in Medicine, 44, 2000, pp. 457-465.
Van Der Kouwe, A.J., et al., "Rapid real-time prospective rigid body motion correction during imaging using cloverleaf navigators", in Proc. Intl. Soc. Mag. Reson. Med., 11, 2004, p. 95.
Wan, E., et al., "Dual Extended Kalman Filter Methods", Chapter 5 in Kalman Filtering and Neural Networks, 2001, pp. 123-173.
Ward, H.A., et al,, "Prospective multiaxial motion correction for fMRI", Magn Reson Med, 43(3), 2000 pp. 459-469.
Weih, K.S., et al., "Online motion correction for diffusion-weighted segmented-EPI and FLASH imaging", Magma, 16 (6), 2004, pp. 277-283.
Welch, E.B., et al., "Spherical navigator echoes for full 3D rigid body motion measurement in MRI", Magn Reson Med, 47(1), 2002, pp. 32-41.
Welch, E.B., et al., "Interscan registration using navigator echoes", Magn Reson Med, 52(6), 2004, pp. 1448-1452.
White, N.S., et al., "Prospective Motion Correction Using Nonlinear Predictive Filtering", Joint Annual Meeting ISMRM-ESMRMB, Berlin, Germany, May 19-25, 2007, p. 1829.
Zhang, J., et al., "Evidence of slow maturation of the superior longitudinal fasciculus in early childhood by diffusion tensor imaging", Neuroimage. 38(2), Aug. 8, 2007, pp. 239-247.
Alexander DC. (2005a): Maximum entropy spherical deconvolution for diffusion MRI. Inf Process Med Imaging 19:76-87.
Alexander DC. (2005b): Multiple-fiber reconstruction algorithms for diffusion MRI. Ann.N.Y.Acad.Sci. 1064:113-133.
Alexander DC, Barker GJ, Arridge SR. (2002): Detection and modeling of non-Gaussian apparent diffusion coefficient profiles in human brain data. Magn Reson Med 48(2):331-40.
Alexander DC, Hubbard PL, Hall MG, Moore EA, Ptito M, Parker GJ, Dyrby TB. (2010): Orientationally invariant indices of axon diameter and density from diffusion MRI. Neuroimage 52(4):1374-89.
Alloway KD, Crist J, Mutic JJ, Roy SA. (1999): Corticostriatal projections from rat barrel cortex have an anisotropic organization that correlates with vibrissal whisking behavior. Journal of Neuroscience 19(24):10908-10922.
Anderson AW. (2005): Measurement of fiber orientation distributions using high angular resolution diffusion imaging. Magn Reson Med 54:1194-1206.
Assaf Y, Basser PJ. (2005): Composite hindered and restricted model of diffusion (CHARMED) MR imaging of the human brain. Neuroimage 27(1):48-58.
Assaf Y, Cohen Y. (2000): Assignment of the water slow-diffusing component in the central nervous system using q-space diffusion MRS: implications for fiber tract imaging. Magn Reson Med 43(2):191-9.
Barazany D, Basser PJ, Assaf Y. (2009): In vivo measurement of axon diameter distribution in the corpus callosum of rat brain. Brain 132(Pt 5):1210-20.
Basser PJ. (2002): Relationships between diffusion tensor and q-space MRI. Magn Reson Med 47(2):392-7.

Basser PJ, Mattiello J, LeBihan D. (1994a): Estimation of the effective self-diffusion tensor from the NMR spin echo. J Magn Reson B 103:247-254.
Basser PJ, Pierpaoli C. (1996): Microstructural and physiological features of tissues elucidated by quantitative-diffusion-tensor MRI. J Magn Reson B 111:209-219.
Beaulieu C. (2002): The basis of anisotropic water diffusion in the nervous system—a technical review. NMR Biomed. 15(7-8):435-455.
Brown LL, Smith DM, Goldbloom LM. (1998): Organizing principles of cortical integration in the rat neostriatum: corticostriate map of the body surface is an ordered lattice of curved laminae and radial points. J.Comp Neurol. 392 (4):468-488.
Chen KC, Nicholson C. (2000): Changes in brain cell shape create residual extracellular space volume and explain tortuosity behavior during osmotic challenge. Proc Natl Acad Sci U S A 97(15):8306-11.
Cowan RL, Wilson CJ. (1994): Spontaneous tiring patterns and axonal projections of single corticostriatal neurons in the rat medial agranular cortex. J.Neurophysiol. 71(1):17-32.
D'Arceuil H, de Crespigny A. (2007): The effects of brain tissue decomposition on diffusion tensor imaging and tractography. Neuroimage. 36(1):64-68.
D'Arceuil HE, Westmoreland S, de Crespigny AJ. (2007): An approach to high resolution diffusion tensor imaging in fixed primate brain. Neuroimage 35(2):553-65.
Dell'Acqua F, Rizzo G, Scifo P, Clarke RA, Scotti G, Fazio F. (2007): A model-based deconvolution approach to solve fiber crossing in diffusion-weighted MR imaging. IEEE Trans Biomed Eng 54:462-472.
Deschenes M, Veinante P, Zhang ZW. (1998): The organization of corticothalamic projections: reciprocity versus parity. Brain Res. Brain Res.Rev. 28(3):286-308.
Descoteaux M, Angelino E, Fitzgibbons S, Deriche R. (2007): Regularized, fast, and robust analytical Q-ball imaging. Magn Reson Med 58(3):497-510.
Zhou FM, Flablitz JJ. (1996): Morphological properties of intracellularly labeled layer I neurons in rat neocortex. J. Comp Neurol. 376(2)198-213.
Hess CP, Mukherjee P, Han ET, Xu D, Vigneron DB. (2006): Q-ball reconstruction of multimodal fiber orientations using the spherical harmonic basis. Magn Reson Med 56(1)104-17.
Jespersen SN, Bjarkam CR, Nyengaard JR, Chakravarty MM, Hansen B, Vosegaard T, Ostergaard L, Yablonskiy D, Nielsen NC, Vestergaard-Poulsen P. (2010): Neurite density from magnetic resonance diffusion measurements at ultrahigh field: comparison with light microscopy and electron microscopy. Neuroimage 49(1):205-16.
Jespersen SN, Kroenke CD, Ostergaard L, Ackerman JJ, Yablonskiy DA. (2007): Modeling dendrite density from magnetic resonance diffusion measurements. Neuroimage 34(4)1473-86.
Jian B, BC. Vemuri BC (2007): A unified computational framework for deconvolution to reconstruct multiple fibers from diffusion weighted MRI. IEEE Trans Med Imaging 26(11):1464-71.
Kaden E, Knosche TR, Anwander A. (2007): Parametric spherical deconvolution: inferring anatomical connectivity using diffusion MR imaging. Neuroimage 37(2):474-88.
Kalisman N, Silberberg G, Markram H. (2005): The neocortical microcircuit as a tabula rasa. Proc Natl Acad Sci U S A 102(3):880-5.
Kristt DA. (1978): Neuronal differentiation in somatosensory cortex of the rat. I. Relationship to synaptogenesis in the first postnatal week. Brain Res. 150(3):467-486.
Leergaard TB, White NS, de Crespigny A, Bolstad I, D'Arceuil H, Bjaalie JG, Dale AM. (2010): Quantitative histological validation of diffusion MRI fiber orientation distributions in the rat brain. PLoS One 5(1):e8595.
Maier SE, Mulkem RV. (2008): Biexponential analysis of diffusion-related signal decay in normal human cortical and deep gray matter. Magn Reson Imaging. 26(7):897-904. Epub May 7, 2008.
Mountcastle VB. (1997): The columnar organization of the neocortex. Brain 120:701-722.

(56) References Cited

OTHER PUBLICATIONS

Mulkem RV, Gudbjartsson H, Westin CF, Zengingonul HP, Gartner W, Guttmann CR, Robertson RL, Kyriakos W, Schwartz R, Holtzman D and others. (1999): Multi-component apparent diffusion coefficients in human brain. NMR Biomed. 12(1):51-62.

Mulkern RV, Haker SJ, Maier SE. (2009): On high b diffusion imaging in the human brain: ruminations and experimental insights. Magn Reson Imaging 27(8)1151-62.

Nicholson C, Sykova E. (1998): Extracellular space structure revealed by diffusion analysis. Trends Neurosci 21 (5):207-15.

Niendorf T, Dijkhuizen RM, Norris DG, van Lookeren Campagne M, Nicolay K. (1996): Biexponential diffusion attenuation in various states of brain tissue: implications for diffusion-weighted imaging. Magn Reson Med. 36 (6):847-57.

Oberheim NA, Tian GF, Han X, Peng W, Takano T, Ransom B, Nedergaard M. (2008): Loss of astrocytic domain organization in the epileptic brain. J Neurosci 28(13):3264-76.

Ozarslan E, Shepherd TM, Vemuri BC, Blackband SJ, Mareci TH. (2006): Resolution of complex tissue microarchitecture using the diffusion orientation transform (DOT). Neuroimage 31(3):1086-103.

Partadiredja G, Miller R, Oorschot DE. (2003): The number, size, and type of axons in rat subcortical white matter on left and right sides: a stereological, ultrastructural study. J Neurocytol 32(9):1165-79.

Ronen I, Kim KH, Garwood M, Ugurbil K, Kim DS. (2003): Conventional DTI vs. slow and fast diffusion tensors in cat visual cortex. Magn Reson Med 49(5):785-90.

Sadek AR, Magill PJ, Bolam JP. (2007): A single-cell analysis of intrinsic connectivity in the rat globus pallidus. Journal of Neuroscience 27(24):6352-6362.

Schwarz G. (1978): Estimating the Dimension of a Model. Ann. Statist 6(2):461-464.

Solenov E, Watanabe H, Manley GT, Verkman AS. (2004): Sevenfold-reduced osmotic water permeability in primary astrocyte cultures from AQP-4-deficient mice, measured by a fluorescence quenching method. Am J Physiol Cell Physiol 286(2):C426-32.

Sykova E, Nicholson C. (2008): Diffusion in brain extracellular space. Physiol. Rev. 88(4):1277-1340.

Szentagothai J. (1975): The 'module-concept' in cerebral cortex architecture. Brain Res. 95(2-3):475-496.

Tao A, Tao L, Nicholson C. (2005): Cell cavities increase tortuosity in brain extracellular space. J Theor Biol 234 (4):525-36.

Veinante P, Deschenes M. (2003): Single-cell study of motor cortex projections to the barrel field in rats. J.Comp Neurol. 464(1):98-103.

Wedeen VJ, Hagmann P, Tseng WY, Reese TG, Weisskoff RM. (2005): Mapping complex tissue architecture with diffusion spectrum magnetic resonance imaging. Magn Reson Med 54:1377-1386.

White NS, Dale AM. (2009): Optimal diffusion MRI acquisition for fiber orientation density estimation: An analytic approach. Human Brain Mapping:In press.

Wilhelmsson U, Bushong EA, Price DL, Smarr BL, Phung V, Terada M, Ellisman MH, Pekny M. (2006): Redefining the concept of reactive astrocytes as cells that remain within their unique domains upon reaction to injury. Proc Natl Acad Sci U S A 103(46):17513-8.

Wu HS, Sugihara I, Shinoda Y. (1999): Projection patterns of single mossy fibers originating from the lateral reticular nucleus in the rat cerebellar cortex and nuclei. J.Comp Neurol. 411(1):97-118.

Yablonskiy DA, Sukstanskii AL. (2010): Theoretical models of the diffusion weighted MR signal. NMR Biomed 23 (7):661-81.

Fulton JF. 1938. The cerebral cortex: architecture, intracortical connections and motor projections. Physiology of the Nervous System. London: Oxford University Press. p. 291-321.

* cited by examiner

| Fiber Name | Description |
| --- | --- |
| corpus callosum | major bundle of inter-hemispheric connections |
| forceps major | posterior, occipital portion of corpus callosum |
| forceps minor | anterior, frontal portion of corpus callosum |
| cingulum (cing) | cingulate portion of cingulum: connects cingulate gyrus and entorhinal cortex |
| cingulum (hipp) | parahippocampal portion of cingulum |
| fornix | connects hippocampus and mammilary nuclei of hypothalamus |
| IFOF | inferior frontal occipital fasciculus: connects occipital and frontal lobes |
| ILF | inferior longitudinal fasciculus: connects occipital and temporal lobes |
| pyramidal | pyramidal or corticospinal tract: connects motor cortex and spinal cord |
| SLF | superior longitudinal fasciculus: connects temporal and parietal lobes with frontal lobe |
| tSLF | portion of SLF that ascends from temporal lobe and connects to frontal lobe (arcuate fasciculus) |
| ant. thalamic | anterior thalamic radiations: connects thalamus with frontal lobe |
| uncinate | connects inferior frontal and anterior temporal lobes |

| Fiber Name | Manual | | Atlas | | Atlas (no threshold) | |
|---|---|---|---|---|---|---|
|  | F-stat | p | F-stat | p | F-stat | p |
| corpus callosum | 7.57 | 0.0017 | 8.56 | 0.0009 | 7.53 | 0.0018 |
| forceps major | 8.15 | 0.0011 | 5.49 | 0.0081 | 4.20 | 0.0225 |
| forceps minor | 5.86 | 0.0060 | 9.38 | 0.0005 | 7.91 | 0.0013 |
| R cingulum (cing) | 1.90 | 0.1638 | 2.45 | 0.0999 | 2.03 | 0.1458 |
| L cingulum (cing) | 7.44 | 0.0019 | 3.95 | 0.0277 | 1.83 | 0.1742 |
| R cingulum (hipp) | 7.75 | 0.0015 | 10.35 | 0.0003 | 10.68 | 0.0002 |
| L cingulum (hipp) | 5.17 | 0.0104 | 11.50 | 0.0001 | 11.52 | 0.0001 |
| R fornix | 1.38 | 0.2659 | 2.06 | 0.1413 | 1.28 | 0.2908 |
| L fornix | 5.32 | 0.0093 | 2.17 | 0.1282 | 1.72 | 0.1928 |
| R IFOF | 5.24 | 0.0098 | 6.49 | 0.0038 | 5.69 | 0.0069 |
| L IFOF | 4.25 | 0.0216 | 6.36 | 0.0042 | 5.94 | 0.0057 |
| R ILF | 2.70 | 0.0802 | 2.29 | 0.1155 | 2.19 | 0.1262 |
| L ILF | 3.36 | 0.0455 | 4.69 | 0.0151 | 6.03 | 0.0053 |
| R pyramidal | 3.04 | 0.0595 | 2.96 | 0.0641 | 2.33 | 0.1108 |
| L pyramidal | 0.37 | 0.6910 | 1.57 | 0.2212 | 2.31 | 0.1130 |
| R SLF | 2.42 | 0.1025 | 4.82 | 0.0136 | 4.77 | 0.0142 |
| L SLF | 6.58 | 0.0036 | 6.73 | 0.0031 | 5.35 | 0.0090 |
| R tSLF | 3.38 | 0.0476 | 3.42 | 0.0430 | 4.17 | 0.0230 |
| L tSLF | 5.24 | 0.0099 | 4.89 | 0.0129 | 4.61 | 0.0161 |
| R ant. thalamic | 1.38 | 0.2649 | 4.33 | 0.0203 | 5.00 | 0.0118 |
| L ant. thalamic | 6.18 | 0.0047 | 8.41 | 0.0009 | 8.33 | 0.0010 |
| R uncinate | 1.02 | 0.3699 | 4.10 | 0.0245 | 3.20 | 0.0521 |
| L uncinate | 1.81 | 0.1779 | 7.62 | 0.0016 | 7.27 | 0.0021 |

| Fiber Name | Control | LTLE | RTLE |
|---|---|---|---|
| corpus callosum | 21 | 9 | 11 |
| forceps major | 21 | 9 | 11 |
| forceps minor | 21 | 9 | 11 |
| R cingulum (cing) | 21 | 9 | 11 |
| L cingulum (cing) | 21 | 9 | 11 |
| R cingulum (hipp) | 21 | 9 | 11 |
| L cingulum (hipp) | 21 | 9 | 11 |
| R fornix | 19 | 9 | 10 |
| L fornix | 20 | 9 | 11 |
| R IFOF | 21 | 9 | 11 |
| L IFOF | 21 | 9 | 11 |
| R ILF | 21 | 9 | 11 |
| L ILF | 21 | 9 | 11 |
| R pyramidal | 21 | 9 | 11 |
| L pyramidal | 21 | 9 | 11 |
| R SLF | 21 | 9 | 11 |
| L SLF | 20 | 9 | 11 |
| R tSLF | 18 | 6 | 9 |
| L tSLF | 20 | 9 | 11 |
| R ant. Thalamic | 21 | 9 | 11 |
| L ant. Thalamic | 21 | 9 | 11 |
| R uncinate | 21 | 9 | 11 |
| L uncinate | 21 | 9 | 11 |

| Fiber Name | Control | | LTLE | | RTLE | |
|---|---|---|---|---|---|---|
| corpus callosum | 0.46 | ± 0.02 | 0.44 | ± 0.02 | 0.44 | ± 0.02 |
| forceps major | 0.51 | ± 0.03 | 0.49 | ± 0.02 | 0.47 | ± 0.02 |
| forceps minor | 0.44 | ± 0.02 | 0.41 | ± 0.03 | 0.42 | ± 0.03 |
| R cingulum (cing) | 0.36 | ± 0.02 | 0.35 | ± 0.03 | 0.35 | ± 0.01 |
| L cingulum (cing) | 0.38 | ± 0.02 | 0.35 | ± 0.03 | 0.38 | ± 0.03 |
| R cingulum (hipp) | 0.31 | ± 0.03 | 0.29 | ± 0.03 | 0.28 | ± 0.02 |
| L cingulum (hipp) | 0.31 | ± 0.02 | 0.28 | ± 0.03 | 0.30 | ± 0.02 |
| R fornix | 0.26 | ± 0.02 | 0.25 | ± 0.02 | 0.26 | ± 0.03 |
| L fornix | 0.26 | ± 0.03 | 0.23 | ± 0.03 | 0.27 | ± 0.03 |
| R IFOF | 0.41 | ± 0.02 | 0.38 | ± 0.03 | 0.40 | ± 0.02 |
| L IFOF | 0.41 | ± 0.02 | 0.39 | ± 0.03 | 0.41 | ± 0.02 |
| R ILF | 0.39 | ± 0.02 | 0.37 | ± 0.03 | 0.37 | ± 0.02 |
| L ILF | 0.40 | ± 0.02 | 0.38 | ± 0.03 | 0.39 | ± 0.02 |
| R pyramidal | 0.46 | ± 0.04 | 0.46 | ± 0.02 | 0.49 | ± 0.03 |
| L pyramidal | 0.47 | ± 0.02 | 0.47 | ± 0.02 | 0.47 | ± 0.03 |
| R SLF | 0.41 | ± 0.02 | 0.39 | ± 0.02 | 0.40 | ± 0.02 |
| L SLF | 0.40 | ± 0.02 | 0.37 | ± 0.02 | 0.40 | ± 0.03 |
| R tSLF | 0.42 | ± 0.02 | 0.39 | ± 0.04 | 0.41 | ± 0.02 |
| L tSLF | 0.42 | ± 0.02 | 0.39 | ± 0.02 | 0.41 | ± 0.02 |
| R ant. thalamic | 0.38 | ± 0.01 | 0.36 | ± 0.02 | 0.37 | ± 0.02 |
| L ant. thalamic | 0.38 | ± 0.01 | 0.36 | ± 0.02 | 0.39 | ± 0.01 |
| R uncinate | 0.35 | ± 0.02 | 0.34 | ± 0.01 | 0.34 | ± 0.03 |
| L uncinate | 0.35 | ± 0.02 | 0.34 | ± 0.01 | 0.35 | ± 0.02 |

| Fiber Name | Control | | LTLE | | RTLE | |
|---|---|---|---|---|---|---|
| corpus callosum | 0.45 | ± 0.02 | 0.42 | ± 0.03 | 0.42 | ± 0.02 |
| forceps major | 0.47 | ± 0.03 | 0.45 | ± 0.03 | 0.44 | ± 0.02 |
| forceps minor | 0.43 | ± 0.02 | 0.39 | ± 0.03 | 0.40 | ± 0.02 |
| R cingulum (cing) | 0.35 | ± 0.02 | 0.33 | ± 0.03 | 0.33 | ± 0.02 |
| L cingulum (cing) | 0.36 | ± 0.02 | 0.34 | ± 0.02 | 0.36 | ± 0.03 |
| R cingulum (hipp) | 0.30 | ± 0.02 | 0.27 | ± 0.02 | 0.27 | ± 0.02 |
| L cingulum (hipp) | 0.29 | ± 0.01 | 0.26 | ± 0.02 | 0.28 | ± 0.02 |
| R fornix | 0.29 | ± 0.02 | 0.27 | ± 0.03 | 0.28 | ± 0.02 |
| L fornix | 0.28 | ± 0.02 | 0.26 | ± 0.02 | 0.27 | ± 0.01 |
| R IFOF | 0.39 | ± 0.02 | 0.36 | ± 0.02 | 0.38 | ± 0.02 |
| L IFOF | 0.39 | ± 0.02 | 0.36 | ± 0.03 | 0.38 | ± 0.02 |
| R ILF | 0.37 | ± 0.02 | 0.36 | ± 0.02 | 0.35 | ± 0.02 |
| L ILF | 0.38 | ± 0.02 | 0.36 | ± 0.03 | 0.37 | ± 0.02 |
| R pyramidal | 0.47 | ± 0.02 | 0.45 | ± 0.02 | 0.47 | ± 0.02 |
| L pyramidal | 0.46 | ± 0.02 | 0.45 | ± 0.02 | 0.46 | ± 0.02 |
| R SLF | 0.38 | ± 0.02 | 0.36 | ± 0.02 | 0.38 | ± 0.02 |
| L SLF | 0.38 | ± 0.02 | 0.36 | ± 0.01 | 0.38 | ± 0.02 |
| R tSLF | 0.39 | ± 0.02 | 0.37 | ± 0.02 | 0.39 | ± 0.02 |
| L tSLF | 0.39 | ± 0.02 | 0.37 | ± 0.02 | 0.39 | ± 0.02 |
| R ant. thalamic | 0.37 | ± 0.01 | 0.35 | ± 0.02 | 0.37 | ± 0.02 |
| L ant. thalamic | 0.37 | ± 0.01 | 0.35 | ± 0.02 | 0.38 | ± 0.01 |
| R uncinate | 0.34 | ± 0.02 | 0.32 | ± 0.01 | 0.33 | ± 0.03 |
| L uncinate | 0.34 | ± 0.02 | 0.31 | ± 0.01 | 0.34 | ± 0.02 |

| Fiber Name | Control | | LTLE | | RTLE | |
|---|---|---|---|---|---|---|
| corpus callosum | 0.42 | ± 0.02 | 0.39 | ± 0.04 | 0.39 | ± 0.02 |
| forceps major | 0.43 | ± 0.04 | 0.40 | ± 0.04 | 0.39 | ± 0.03 |
| forceps minor | 0.40 | ± 0.02 | 0.36 | ± 0.04 | 0.37 | ± 0.03 |
| R cingulum (cing) | 0.31 | ± 0.03 | 0.30 | ± 0.03 | 0.30 | ± 0.02 |
| L cingulum (cing) | 0.33 | ± 0.03 | 0.30 | ± 0.02 | 0.33 | ± 0.03 |
| R cingulum (hipp) | 0.26 | ± 0.02 | 0.22 | ± 0.03 | 0.22 | ± 0.02 |
| L cingulum (hipp) | 0.25 | ± 0.02 | 0.21 | ± 0.02 | 0.23 | ± 0.02 |
| R fornix | 0.24 | ± 0.03 | 0.22 | ± 0.04 | 0.22 | ± 0.05 |
| L fornix | 0.23 | ± 0.04 | 0.21 | ± 0.04 | 0.20 | ± 0.04 |
| R IFOF | 0.37 | ± 0.02 | 0.34 | ± 0.02 | 0.36 | ± 0.02 |
| L IFOF | 0.37 | ± 0.02 | 0.34 | ± 0.03 | 0.36 | ± 0.02 |
| R ILF | 0.33 | ± 0.02 | 0.32 | ± 0.02 | 0.32 | ± 0.02 |
| L ILF | 0.35 | ± 0.02 | 0.32 | ± 0.02 | 0.34 | ± 0.02 |
| R pyramidal | 0.45 | ± 0.02 | 0.43 | ± 0.02 | 0.44 | ± 0.03 |
| L pyramidal | 0.44 | ± 0.02 | 0.42 | ± 0.01 | 0.44 | ± 0.02 |
| R SLF | 0.35 | ± 0.02 | 0.33 | ± 0.02 | 0.35 | ± 0.02 |
| L SLF | 0.35 | ± 0.02 | 0.32 | ± 0.02 | 0.35 | ± 0.02 |
| R tSLF | 0.36 | ± 0.02 | 0.34 | ± 0.03 | 0.36 | ± 0.02 |
| L tSLF | 0.36 | ± 0.02 | 0.34 | ± 0.02 | 0.36 | ± 0.02 |
| R ant. thalamic | 0.35 | ± 0.02 | 0.33 | ± 0.02 | 0.35 | ± 0.02 |
| L ant. thalamic | 0.35 | ± 0.01 | 0.33 | ± 0.02 | 0.35 | ± 0.01 |
| R uncinate | 0.32 | ± 0.02 | 0.30 | ± 0.01 | 0.31 | ± 0.03 |
| L uncinate | 0.31 | ± 0.02 | 0.29 | ± 0.02 | 0.32 | ± 0.02 |

FIG. 13

IDENTIFYING WHITE MATTER FIBER TRACTS USING MAGNETIC RESONANCE IMAGING (MRI)

CROSS-REFERENCE TO RELATED APPLICATIONS

This application claims the benefit of U.S. Provisional Application No. 61/077,335, filed Jul. 1, 2008, the entire contents of which is hereby incorporated by reference.

STATEMENT REGARDING GOVERNMENT SUPPORT

This invention was made with government support under Grant No. 1U01AG024904-02 awarded by the National Institutes of Health (NIH), the National Institute of Biomedical Imaging and BioEngineering (NIBIB), and the Morphometry Bioinformatics Research Network (MBIRN). The government has certain rights in the invention.

BACKGROUND

This application relates to MRI techniques and systems.

Imaging through MRI techniques is well known and has been widely applied in imaging applications in medical, biological and other fields. A typical MRI technique produces an image of an object under examination by manipulating the magnetic spins in the object and processing measured responses from the magnetic spins. An MRI system may include hardware to generate different magnetic fields for imaging, including a static magnetic field along a z-direction to polarize a portion of the magnetic spins, magnetic field gradients (e.g., along mutually orthogonal x, y, or z directions), and rf magnetic fields to manipulate the spins.

SUMMARY

This application relates to identifying fibers using MRI. A fiber tract atlas is used to calculate a probability that a measured region of a subject corresponds to a fiber tract.

In one general aspect, a fiber tract atlas for a nervous system is obtained. The fiber tract atlas includes atlas voxels that each represent a different volume element of the nervous system; a first atlas voxel represents a first volume element of the nervous system. The fiber tract atlas also includes information on orientations of a first fiber tract in the first volume element of the nervous system. Magnetic resonance data is acquired from the nervous system of a subject. The magnetic resonance data includes data voxels; a first data voxel relates to the first atlas voxel. A diffusion vector is generated for the first data voxel based at least in part on the acquired magnetic resonance data. The fiber tract atlas is used to find a probability that the first data voxel belongs to the first fiber tract based at least in part on the generated diffusion vector and the information on the orientations of the first fiber tract in the first volume element.

Implementations may include one or more of the following features. The fiber tract atlas also includes a location probability for the first atlas voxel, and the location probability represents a probability that the first fiber tract resides in first volume element. The location probability and the information on orientations of the first fiber tract are resampled from an atlas space to a subject space for the subject, and the found probability is based in part on the resampled location probability and the resampled orientation information. The nervous system includes a human nervous system. The information on the orientations of the first fiber tract includes an average diffusion tensor based at least in part on measurements of multiple human nervous systems. Using the fiber tract atlas to find the probability that the first data voxel represents the first fiber tract is based at least in part on the generated diffusion vector and the average diffusion tensor. The information on the orientations of the first fiber tract includes a first tensor for the first atlas voxel. The fiber tract atlas also includes an additional tensor for each other atlas voxel. The additional tensor for each other atlas voxel represents orientation of the first fiber tract in the atlas voxel. The fiber tract atlas is used to find an additional probability for each other data voxel. The additional probability for each other data voxel is based at least in part on the generated diffusion vector for the data voxel and the additional tensor for an atlas voxel that relates to the data voxel. The additional probability for each data voxel indicates a probability that the data voxel represents the first fiber tract. How the first data voxel relates to the first atlas voxel is determined by registering a $T_1$-weighted image to an atlas space of the fiber tract atlas and resampling the data voxels into the atlas space. The fiber tract atlas includes additional tensors that each represent the orientations of additional fiber tracts in the first volume element of the nervous system. The found probability is a first probability, and the fiber tract atlas is used to find additional probabilities based at least in part on the generated diffusion vector and the additional tensors. Each additional probability represents a relative probability that the first data voxel represents one of the additional fiber tracts. The fiber tract atlas is constructed by acquiring additional magnetic resonance data from nervous systems of additional subjects, generating an additional diffusion tensor for each data voxel of each additional subject based at least in part on the additional magnetic resonance data, and generating an average diffusion tensor for each atlas voxel of the fiber tract atlas by averaging the additional diffusion tensors across the additional subjects. The information on the orientations of the first fiber tract includes a rank-two symmetric tensor (T) having an eigenvector ($\bar{v}$). The diffusion vector includes an additional eigenvector (v) of a second diffusion tensor; the second diffusion tensor is based at least in part on the acquired magnetic resonance data. The fiber tract atlas is used to find the probability by combining the rank-two symmetric tensor T, the eigenvector ($\bar{v}$), and the additional eigenvector v. The values can be combined according to $$\frac{v'T v}{\bar{v}'T\bar{v}}.$$

The fiber tract atlas and the acquired magnetic resonance data are used to generate a fiber probability map for at least a first portion of the nervous system of the subject. The probability map is used to determine a fractional anisotropy for the first fiber tract and/or a diffusivity for the first fiber tract. Acquiring magnetic resonance data can include applying radio frequency pulses to the subject, applying gradient fields to the subject, and detecting echo signals from the subject. An MRI system includes a data acquisition system adapted to acquire the magnetic resonance data from the nervous system of a subject. The MRI system also includes a data processor that receives the magnetic resonance data from the magnetic resonance data acquisition system. The data processor includes mechanisms that perform the described operations. The MRI system can include a magnet that generates a substantially static principal magnetic field, a gradient sub-system that applies the gradient fields to the subject, and a radio frequency sub-system that applies the radio frequency pulses to the subject and detects the echo signals from the subject.

BRIEF DESCRIPTION OF DRAWINGS

FIG. 5 is a table that includes descriptions of example fibers of a nervous system.

FIG. 6 is a table that includes example fiber data for a nervous system.

FIG. 10 is a table that includes data describing the number of subjects in an example study.

FIG. 11 is a table that includes example fractional anisotropy data for a nervous system.

FIG. 12 is a table that includes example fractional anisotropy data for a nervous system.

FIG. 13 is a table that includes example fractional anisotropy data for a nervous system.

DETAILED DESCRIPTION

Figure 1:
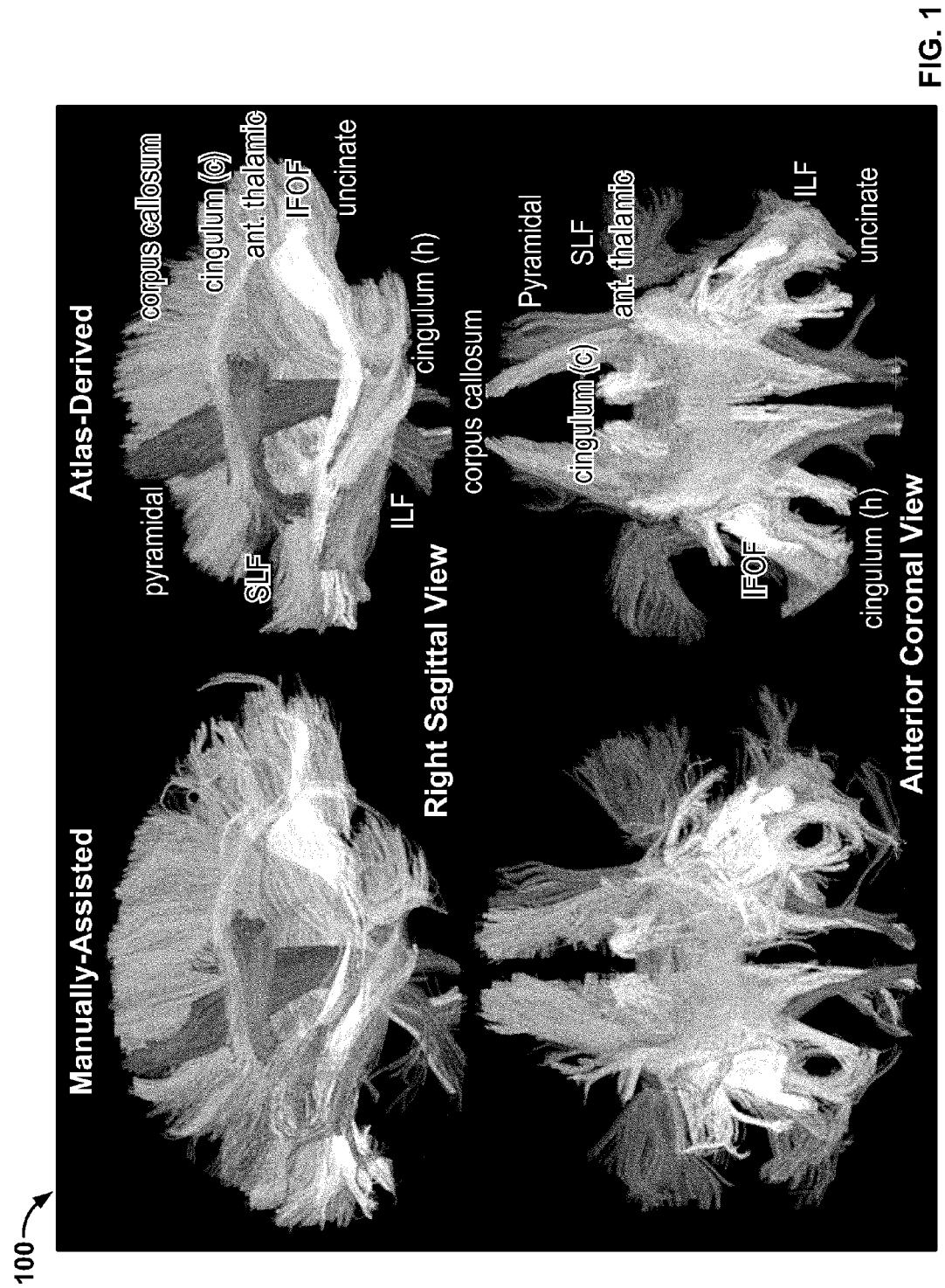
FIG. 1 is a diagram showing an example representation of fiber tracks for a nervous system.

Diffusion-weighted magnetic resonance imaging (MRI) allows researchers and clinicians to identify individual white matter fiber tracts and map their trajectories. The reliability and interpretability of fiber tracking procedures can be improved when a priori anatomical information is used as a guide. An automated technique for labeling white matter fiber tracts in individual subjects is based on a probabilistic atlas of fiber tract locations and orientations.

In an example implementation, the probabilistic fiber atlas contains twenty-three fiber tracts. The example probabilistic fiber atlas was constructed by manually identifying fiber tracts in twenty-one healthy controls and twenty-one patients with temporal lobe epilepsy (TLE). An example manual tract identification technique utilized approximately forty hours of manual editing by a trained image analyst using multiple regions of interest to select or exclude streamline fibers. Identification of fiber tracts with the example fiber tract atlas does not require human intervention, but nonetheless benefits from the a priori anatomical information that was used to manually identify the tracts included in the example atlas. This technique was applied to compare fractional anisotropy—thought to be a measure of white matter integrity—in individual fiber tracts between control subjects and TLE patients. In the example implementations, the atlas-based and manual fiber selection techniques produced a similar pattern of results. The between-group effect sizes using the atlas-derived fibers may be as large or larger than those obtained with manually selected fiber tracks.

The described techniques for labeling white matter fiber tracts in individual subjects can be implemented based on T1-weighted and diffusion-weighted MRI images. A probabilistic atlas can be used to calculate three-dimensional relative probability maps of several white matter fiber tracts. These probability maps can serve as regions of interest that can be used to extract MRI-derived measures of interest for each fiber tract. Examples of measures of interest include fraction anisotropy, diffusivity, and others.

The automated techniques can be implemented without human intervention, and the technique can efficiently identify a large number of fiber tracts. The technique is less susceptible to noise in the diffusion data and automatically excludes stray fibers that do not agree with the location and orientation information contained in the atlas. In some implementations, the amount of time required for analysis and/or the role of trained image analysts may be reduced.

The described techniques may include the use of fiber orientation information from diffusion imaging to refine the fiber probability estimates. This can individualize the fiber ROIs for each subject and/or reduce (or minimize) the contribution from regions that exhibit diffusion orientations inconsistent with the consensus fiber orientation information contained in the orientation atlas. Nonlinear registration may provide better alignment between subjects and atlas than that provided by affine registration. Additionally, the described technique, in some implementations, includes a robust correction of $B_0$ distortion, providing excellent registration between diffusion images and the $T_1$-weighted structural images used to register to atlas space. The described techniques can be implemented without streamline tractography, which may reduce errors such as stray fibers due to noise in the diffusion-weighted MRI images.

The described techniques have been demonstrated to be suitable for use in group analyses, in a comparison of healthy controls and patients with temporal lobe epilepsy. The described techniques could be used for presurgical planning, for example in patients undergoing brain tissue removal for the treatment of intractable epilepsy or tumors. The quantification of white matter properties for individual fiber tracts can also potentially be useful for diagnostic purposes. Quantification of white matter tracts based on diffusion MRI has the potential of becoming a routine part of clinical practice. The automation and accuracy provided by the described techniques can make such quantification easier and more practical for individual neurology and radiology practices, as well as imaging centers and remote processing providers.

Diffusion imaging (DI) is a form of Magnetic Resonance Imaging (MRI) that can be used to estimate the diffusion coefficient of water along multiple orientations. Oriented diffusion can be represented, to first order, by a tensor. In white matter, water diffusion occurs primarily along axons, so the primary orientation estimated from diffusion tensor (DT) calculations can be used to infer white matter fiber orientations. Fractional anisotropy (FA) is a measure derived from DT calculations that describes the degree to which diffusion coefficients along the three orthogonal principal axes are different from each other. FA ranges from 0 to 1, with a value of 1 indicating diffusion exclusively in a single direction, and a value of 0 indicating isotropic diffusion. Gray matter tends to have a low FA (e.g. <0.15), while the FA of white matter typically depends on the population of fibers in a given voxel. Decreases in FA relative to normal controls for clinical populations are often used as a measure of white matter integrity, for example in the study of epilepsy. It should be noted, however, that a number of factors could potentially affect FA; for example, myelination, the fraction of free water, the presence or absence of crossing fibers, etc. As such, FA may not be directly or exclusively related to white matter integrity, but it is a convenient and widely used measure.

Studies examining such differences may use voxel-wise statistical comparisons, manually defined regions of interest (ROIs), or ROIs defined via white matter tractography techniques. Statistical maps for voxel-wise analyses are corrected for multiple comparisons and may lack statistical power compared to ROI analyses. Both voxel-wise and template-based ROI analyses may include inter-subject registration, which is often done with affine transformations (e.g. Talairach registration). Affine transformations do not necessarily provide good correspondence across subjects in the specific white matter fibers contained in a given atlas space location, so apparent differences in FA or other measures could result from differences in fiber location rather than intrinsic fiber properties. Fiber tract ROIs defined with tractography techniques are created for individual subjects to encompass all or part of particular fiber tracts, and can be used for group analyses as well as in clinical settings such as presurgical planning.

White matter tractography may be implemented with a technique known as "deterministic" tractography or with a "probabilistic" tractography technique. With deterministic tractography, seeds are placed in voxels with FA greater than some threshold—e.g. 0.15 to include only white matter voxels—and then grown in both directions along the dominant diffusion orientation into fiber tracks or streamlines. Here, the term "tracks" may refer to one or more of these streamline paths, in distinction to the anatomical tracts themselves. As a track is extended into a neighboring voxel, the dominant diffusion orientation in that voxel determines where to next extend the track. A track is terminated when it reaches a voxel with sub-threshold FA, or when the turning angle exceeds some threshold (e.g. 50°). Manually drawn ROIs are used to select tracks that pass through one or more regions, as well as to exclude tracks that stray into undesired locations because of crossing fibers or measurement noise. In some cases, an ROI selection strategy may be used for each fiber tract of interest, guided by anatomical knowledge of the trajectory of known fiber tracts.

Probabilistic tractography techniques probe the fiber orientation probability distributions at each voxel, assessing the likelihood of a fiber following a particular path given the diffusion data. This technique may allow explicit representation of uncertainty in the data. In addition, probabilistic tractography techniques can, in some implementations, more reliably reconstruct crossing fibers. These techniques can utilize thousands of iterations, and is thus computationally intensive. Like the deterministic tracking technique, prior knowledge of the anatomy of fiber tracts can be used for distinguishing between fiber tracts of interest and streamline tracks that follow improbable routes or suggest non-existent connections between brain areas.

An alternative approach is to view the identification of fiber tracts as a segmentation problem, analogous to that of segmenting subcortical structures from $T_1$-weighted MR images. In that case, voxels belonging to particular subcortical structures can be identified using a combination of image intensity and prior information—in the form of a probabilistic atlas—about the likelihood of a particular label given the location in atlas space.

A segmentation approach can be used to label white matter fiber tracts in individual subjects by using diffusion weighted images, $T_1$-weighted images, and a probabilistic atlas of fiber tract locations and orientations. In an example implementation, the fiber atlas contains twenty-three fiber tracts, twenty of which are made up of ten left-right hemisphere pairs. Since this technique does not require human intervention, other than in the construction of the atlas, inter-operator variability can be eliminated. Example results from applying this technique to a cohort of temporal lobe epilepsy (TLE) patients and age-matched healthy controls suggest that the group effect sizes are comparable or greater than using manual procedures. Thus, the described techniques have the potential to be of great utility in both research and clinical settings.

In an example study involving human subjects, all participants provided written consent prior to enrollment in the study, which was approved by the Institutional Review Board. Twenty-one healthy control subjects (ages twenty-one to fifty-two, mean age of thirty three, standard deviation of 10.2 years) were recruited through open advertisement. This control group included 11 females and 10 males with no known history of neurological disorder, loss of consciousness, or serious medical or psychiatric condition. Twenty-one TLE patients were also enrolled in the study (ages twenty-one to fifty-four, mean age of 37.3, standard deviation of 10.0 years). All patients in the example study were recruited from the University of California, San Diego, Epilepsy Center and diagnosed by a board-certified neurologist with expertise in epileptology. The patient and control groups were age- and gender-matched, with no significant difference in mean age. Handedness in all participants was assessed with the Edinburgh Handedness Inventory. Two control subjects and two left TLE patients were left-handed. One left TLE patient was excluded after it was discovered that incorrect scan parameters were used during collection of the diffusion data (b=2000 instead of b=1000).

In the example study, patients were classified as left or right TLE according to video-EEG telemetry, seizure semiology, and neuroimaging results. Subjects with either an epileptic focus or radiological evidence of pathology outside the temporal regions were excluded. In all twenty-one patients with TLE, the diagnosis was based on the presence of ictal and interictal temporal-lobe epileptiform activity as monitored by video-EEG telemetry. In the majority of patients, scalp recordings were supplemented with sphenoidal electrodes. In some cases, patients underwent monitoring with five-contact foramen ovale electrodes to confirm mesial temporal onset. According to these criteria, eleven patients were diagnosed with unilateral right TLE and ten with unilateral left TLE. Diagnoses were supported in sixteen of twenty-one patients by the presence of hippocampal atrophy and increased signal on $T_2$-weighted images, consistent with mesial temporal sclerosis (MTS). In no case was there evidence of dual-pathology on MRI. The remaining five patients showed no evidence of MTS based on visual inspection by a neuroradiologist with expertise in epilepsy. The imaging protocol was identical for all participants, and all patients were seizure-free for a minimum of 24-hours prior to the MRI scan in order to avoid the possible effects of acute postictal changes on diffusion parameters.

In the example study, magnetic resonance imaging (MRI) was performed at the UCSD Radiology Imaging Laboratory on a General Electric 1.5T EXCITE HD scanner with an 8-channel phased-array head coil. Image acquisitions included a conventional 3-plane localizer, GE calibration scan, two $T_1$-weighted 3D structural scans (TE=3.8 ms, TR=10.7 ms, T1=1 sec, flip angle-8 deg, bandwidth=15.63 kHz, FOV=25.6 cm, matrix=192×192, slice thickness=1.0 mm), and five diffusion-weighted (DW) sequences. Diffusion data were acquired using single-shot echo-planar imaging with isotropic 2.5 mm voxels (matrix size=96×96, FOV=24 cm, 47 axial slices, slice thickness=2.5 mm), covering the entire cerebrum and brainstem without gaps. Three volume series were acquired with fifty-one diffusion gradient directions using b-value of 600 $mm^2/s$ (TE/TR 68.4/10,900), 800 $mm^2/s$ (TE/TR 72.3/11,700), and 1,000 (TE/TR 75.6/12,300) $mm^2/s$, each with an additional b=0 volume. For use in nonlinear $B_0$ distortion correction, two additional series were acquired with opposite phase encoding polarity.

In the example study, image files in DICOM format were transferred to a Linux workstation for processing with a customized, automated, processing stream written in MATLAB and C++. The two $T_1$-weighted images were rigid body registered to each other and reoriented into a common space, roughly similar to alignment based on the anterior/posterior commissure line. Images were corrected for non-linear warping caused by non-uniform fields created by the gradient coils (Jovicich, et al. 2006). Image intensities were corrected for spatial sensitivity inhomogeneities in the 8-channel head coil by normalizing with the ratio of a body coil scan to a head coil scan (calculated from the GE PURE calibration scan).

In the example study, five pre-processing steps were performed on the diffusion-weighted images. 1.) Head motion between scans was removed by rigid body registration between the b=0 images of each DW scan. 2.) Within-scan motion was removed using a technique involving the calculation of diffusion tensors (see below for details of diffusion tensor calculations), synthesis of DW volumes from those tensors, and rigid body registration between each data volume and its corresponding synthesized volume. This technique avoids the simplifying assumption that the intensity correlation between DW volumes will be maximal when they are properly aligned, which is typically incorrect since image intensity can vary between diffusion orientations. 3.) Image distortion in the DW volumes caused by eddy currents was minimized by nonlinear optimization with 4 free parameters for each DW volume (translation along the phase-encode direction and scaling along phase-encode direction as a linear function of x, y, or z). 4.) Image distortion caused by magnetic susceptibility artifacts was minimized with a nonlinear $B_0$-unwarping technique using paired images with opposite phase-encode polarities. This technique corrects for nearly all image distortion caused by magnetic susceptibility artifacts and enables highly accurate registration with the $T_1$-weighted images. 5.) Images were resampled using linear interpolation to have 1.875 mm isotropic voxels (63 axial slices). Even though images were acquired with isotropic resolution of 2.5 mm, the images were automatically zero-padded in k-space from 96×96 to 128×128, and reconstructed with 1.875×1.875×2.5 mm voxels.

In the example study, because the three different b-value diffusion scans were collected with three different echo times, the MR signal variations depend not only on diffusion properties, but also $T_2$ time constants. The scanner used in the example study automatically scaled the data such that these differences in signal intensity were reduced, but not eliminated. To correct for residual differences in intensity scaling, additional scaling factors were applied to each of the three diffusion scans. The scaling factors were obtained by calculating the mean signal of the b=0 images. To exclude non-brain and CSF, only voxels within the 75th and 95th percentiles of signal intensity were included in the mean calculation.

In the example study, diffusion tensors were calculated using linear inversion after taking the log of the data, thus performing a monoexponential fit across the three b-values, constrained by the three b=0 volumes and 153 DW volumes (fifty-one independent directions). Diffusion tensors were also calculated for individual scans with single b-values. Diffusion tensors derived from the three b-values were used for manually-assisted fiber tracking, whereas diffusion tensors derived from the b=1000 images alone were used for ROI FA measurements. To account for the rotations for correcting head motion (preprocessing steps 1 and 2 described above), the fifty-one diffusion gradient vectors used by the diffusion pulse sequence were rotated with that component of the motion correction transformation matrices. The tensor matrices were diagonalized using singular value decomposition, obtaining three eigenvectors and three corresponding eigenvalues. The fractional anisotropy ratio (FA) was calculated from the eigenvalues according to equation 1:

$$FA = \sqrt{\frac{3}{2} \times \frac{(\lambda_1 - \bar{\lambda})^2 + (\lambda_2 - \bar{\lambda})^2 + (\lambda_3 - \bar{\lambda})^2}{\lambda_1^2 + \lambda_2^2 + \lambda_3^2}} \quad (1)$$

where $\lambda_i$ is the $i^{th}$ eigenvalue and $\bar{\lambda}$ is the mean of the eigenvalues.

DTI Studio (Laboratory of Brain Anatomical MRI, Johns Hopkins Medical Institute) is freely available software for deterministic fiber tracking that was used in the example study to generate streamline tracks for twenty-three fiber tracts. Brief descriptions of the fiber tracts included in the study can be found in table 500 shown in FIG. 5. Two of the fibers, the forceps major and forceps minor, are subsets of the corpus callosum. The remaining twenty fibers include ten bilateral fiber pairs. The right and left temporal superior longitudinal fasciculi (tSLF), are subsets of the right and left SLF. The cingulum bundles are represented in two separate, cingulate and hippocampal portions. This separation is done primarily because crossing fibers between the two portions of the tract making it difficult or impossible to generate streamlines tracing the entire cingulum with the deterministic tracking algorithm.

In the example study, FA and first eigenvector (V0) volumes were exported to DTI Studio to generate fiber tracks for use as a training set for the fiber atlas. DTI Studio used the "fiber assignment continuous tracking" (FACT) algorithm to connect voxels with similar diffusion orientations into fiber tracks. Seed points were placed at the center of all voxels with FA>0.15 (essentially excluding non-white matter) and fiber tracks were extended until reaching a voxel below that FA threshold or when the fiber track turns by more than a particular angle threshold, in this case 50 degrees. In the example study, it was difficult to obtain complete formix tracks using those settings, so for the formix, fiber tracking was done with an angle threshold of 40 degrees and FA threshold of 0.07. All fibers tracks were then subsequently thresholded to exclude voxels with FA<0.15.

In the example study, each fiber tract was identified using multiple ROIs to select a population of streamlines that followed the paths known from anatomy. Additional ROIs were used to either eliminate or truncate stray fibers that did not conform to a priori knowledge about the particular fiber tract. These manually-assisted fiber tracking procedures have been previously shown to be quite reliable, even for operators without previous fiber tracking experience. In the example study, the manual fiber tracking was performed by an individual who spent several months practicing and refining strategies for consistently and efficiently tracking each fiber tract. All of the manually-assisted fibers tracks included in the present study were generated at the end of this process, in a period of less than a month. The tracking procedure took approximately 2-3 minutes per fiber tract. Thus the manual work involved in generating the atlas training set for the 42 subjects and 23 fiber tracts took approximately 40 hours.

In the example study, the tracking strategies that performed well for most subjects did not necessarily result in satisfactory tracks for all subjects. The presence of crossing fibers is the primary explanation for why a particular tracking strategy may not perform well. For example, all of the streamlines modeling a particular fiber tract may turn and follow a different fiber tract, such that no streamlines actually follow the path of the tract of interest from start to finish. It may have been possible to develop customized tracking strategies for each tract and each subject, but instead of doing that, standardized tracking strategies were used, and tracks were included only when they mapped the full trajectory of the fiber tract of interest. The number of subjects included in the atlas for each fiber is summarized in table 1000 shown in FIG. 10.

In the example study, 3D maps of streamline fiber counts, which are referred to here as fiber density maps, were used to summarize the information obtained from fiber tracking with DTI Studio. Although the number of streamlines in a particular voxel probably does not linearly relate to the density of axons per unit volume, it does indicate the relative likelihood that the voxel truly belongs in the fiber tract of interest. These fiber density maps were used to calculate weighted ROI averages of FA, and provided the location information for the fiber atlas (see below).

Accurate registration between $T_2$-weighted (e.g. b=0 images of DW scans) and $T_1$-weighted images can utilize specialized registration techniques. In the example study, for initial, rough alignment, the $T_2$-weighted images were first rigid-body registered (using intensity correlation) to an average of ten subjects' $T_2$-weighted images that had been previously registered to corresponding $T_1$-weighted images resampled to atlas space. Fine registration between the $T_2$ and $T_1$-weighted images was then done using the joint probability density function (JPDF) technique. The JPDF, a 2-D histogram of intensity values in the $T_1$ and $T_2$-weighted images, was generated for each of the ten previously registered $T_2$-weighted images and then averaged across subjects. Those ten $T_2$-weighted images were themselves aligned to their corresponding $T_1$-weighted images by using a JPDF calculated from a single subject's manually aligned $T_2$-weighted image. Subjects with poor alignment based on this initial JPDF were not included in the average JPDF. In the example study, the average JPDF was able to provide excellent registration (each was visually inspected for registration accuracy) for all subjects.

In the example study, the $T_1$-weighted volume for each subject was non-linearly morphed into alignment with a $T_1$-weighted atlas volume using the technique of discrete cosine transforms with 125 degrees of freedom. DW images were rigid-body registered to the $T_1$-weighted images as described above and the resulting transformation matrix was used to resample the fiber density volumes generated using DTI Studio into the $T_1$-space; they were then non-linearly warped into the $T_1$-weighted atlas space using the previously calculated non-linear transformation for the $T_1$-weighted volume.

In the example study, these co-registered fiber density maps were averaged across subjects. The average fiber density values were then normalized to the maximum average value for each fiber tract. These normalized, average fiber density maps show the relative probability that a fiber tract occupies a given location. The first eigenvectors for each subject were rotated into alignment with the atlas using the registration to $T_1$ and the rigid-body component of the registration to atlas, and then resampled into atlas space. The tensor outer product of these rotated first eigenvectors was calculated, and then for each fiber, smoothed using a specialized tensor smoothing technique (described below). A cross-subject average tensor containing information about the range of possible diffusion orientations at each location in atlas space was then calculated.

Figure 3:
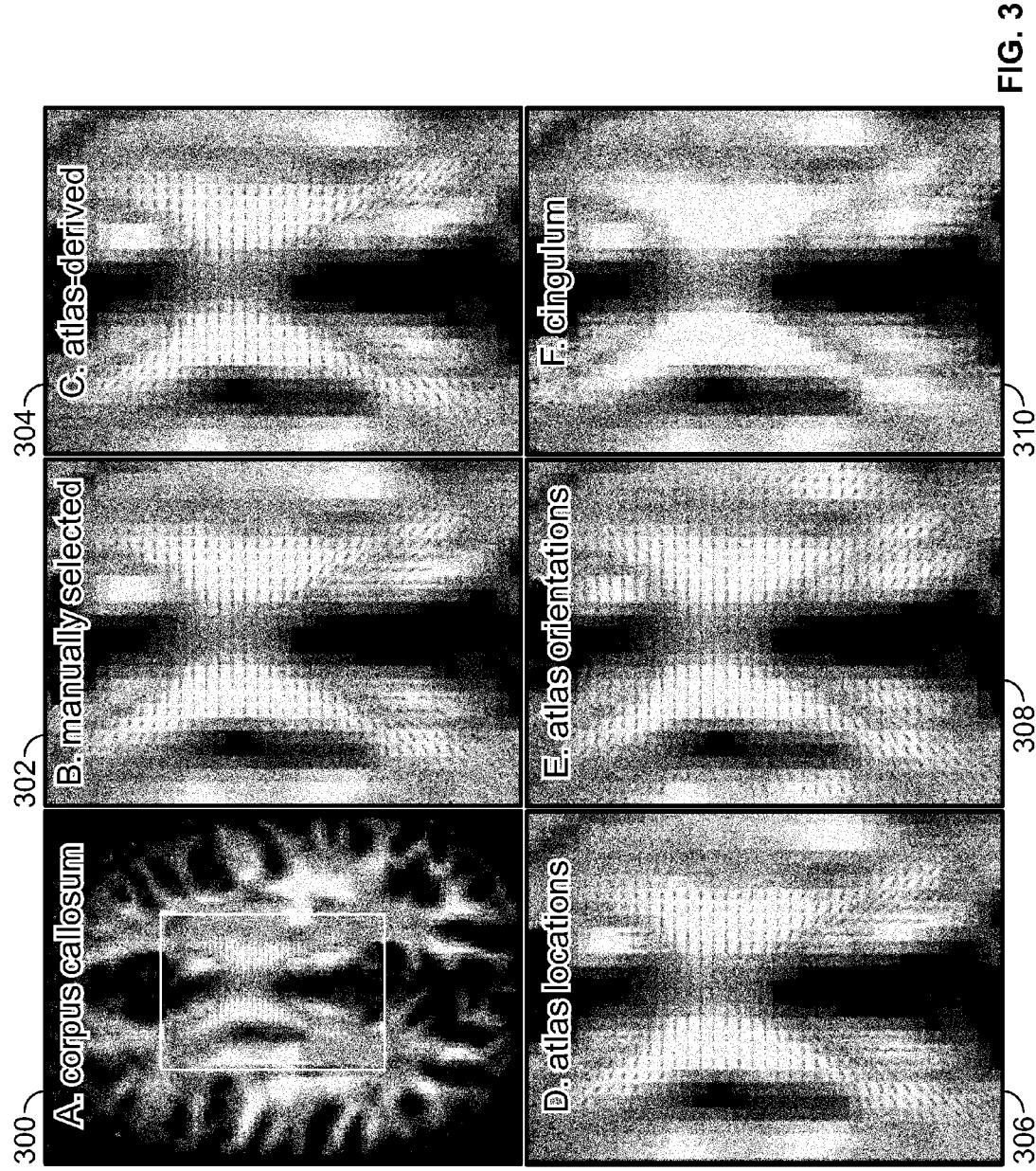
FIG. 3 is a diagram showing an example representation of fiber ROIs for a nervous system.
Figure 4:
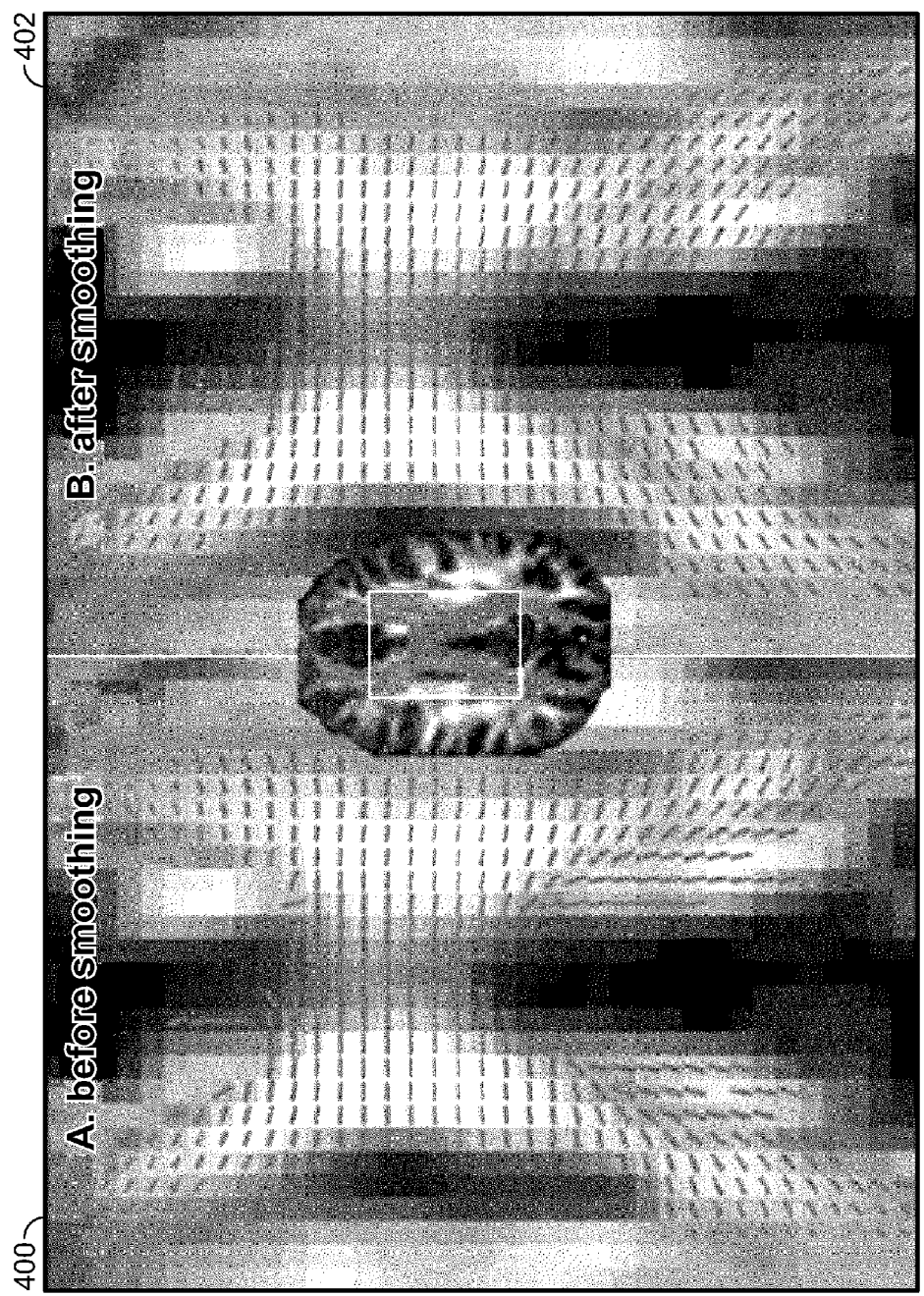
FIG. 4 is a diagram showing an example representation of fiber ROIs for a nervous system.

In the example study, voxels included in the fiber masks sometimes had first eigenvectors that conflicted with the general trajectory of the fiber bundle and their neighboring voxels. This was apparently caused either by streamlines straying into neighboring fiber tracts or by crossing fibers. The tensor smoothing technique was designed so that orientation information used in the atlas reflected the overall trajectory of the fiber bundle and excluded conflicting orientations calculated from diffusion tensor fitting within single subject fiber masks FIGS. 3 and 4 show diffusion orientations of voxels within a manually-selected corpus callosum fiber track ROI, plotted as line segments, overlayed on an axial slice of the FA volume for a control subject. Diagram 400 on the left in FIG. 4 shows orientations from diffusion data before smoothing, and diagram 402 on the right in FIG. 4 shows orientations after fiber smoothing. The smoothed tensor for a voxel was the weighted average of values within a 3-voxel-radius neighborhood. The weighting used was a dominance ratio (DR) calculated from DT eigenvalues that compares the first eigenvalue to the second:

$$DR = \frac{\text{abs}(\lambda_1 - \lambda_2)}{\lambda_1} \qquad (2)$$

where $\lambda_i$ is the $i^{th}$ eigenvalue. DR is largest for voxels with diffusion along a single direction.

In the example study, the atlas, containing probabilistic information about the locations and orientations of each fiber tract, was used to estimate the a posteriori probability that a given voxel belongs to a particular fiber tract. The fiber probability distribution for a single subject is described by equation 3:

$$P(f|v) \propto P(v|f) \times P(f) \qquad (3)$$

where P(f|v) represents the probability of a voxel belonging to a given fiber tract given the first eigenvector v derived from diffusion tensor calculations. P(f) represents the fiber probability given location alone, and is equal to the normalized, average fiber density described above after resampling from atlas space to single-subject-space. P(v|f) represents the fiber probability given the diffusion tensor first eigenvector and was estimated using the atlas average of diffusion tensors (rotated and warped into single subject space) according to equation 4:

$$P(f \mid v) = \frac{v'Tv}{\bar{v}'T\bar{v}} \qquad (4)$$

where $T$ is the atlas tensor generated as described above, $v$ is the first eigenvector of a single subject's diffusion tensor matrix, $v'$ is its transpose, and $\bar{v}$ is the first eigenvector of $T$. In this case, the denominator is equal to the first eigenvalue of $T$. As such, $v$ represents a diffusion vector generated based on a voxel of magnetic resonance data for a subject, and $T$ represents the range of probable orientations of a given fiber tract in that voxel, as indicated by the fiber atlas. Equation (4) is used to find a probability that the voxel of magnetic resonance data corresponds to the given fiber tract.

In the example study, maps of the a posteriori probability calculated with Equation 3, which are referred to herein as atlas-derived fiber ROIs, were used to calculate weighted averages of FA. Voxels with FA less than 0.15 were excluded to facilitate comparisons with the manually selected fiber tracks, which were generated using the same threshold. For comparison, ROI FA measures were also calculated without this FA threshold, as described below. To visually compare atlas-derived fiber masks with manually selected fiber tracks, streamline tracks within the atlas-derived fiber masks were generated using DTI Studio's fiber assignment by continuous tracking (FACT) algorithm. The atlas-derived fiber masks were generated from the fiber probability maps by applying a probability threshold. A threshold was selected by testing a range of thresholds, calculating the volume of suprathreshold voxels, and choosing the threshold that provided the smallest difference in fiber volumes between manually selected and atlas-derived fiber masks across all subjects and fibers.

The described techniques allow automatically labeling white matter fiber tracts using information from single subject diffusion data and a probabilistic fiber atlas. The atlas includes averaged information about the locations and local orientations of the chosen fiber tracts. Fiber ROIs can be derived from the atlas for single subjects using both $T_1$-weighted images and orientation estimates from DT calculations. The $T_1$-weighted images can be used to map the brain into a common space, and DT orientation estimates can be compared to the atlas to obtain a relative probability that a voxel belongs to a particular fiber given the similarity of diffusion orientations.

Figure 7:
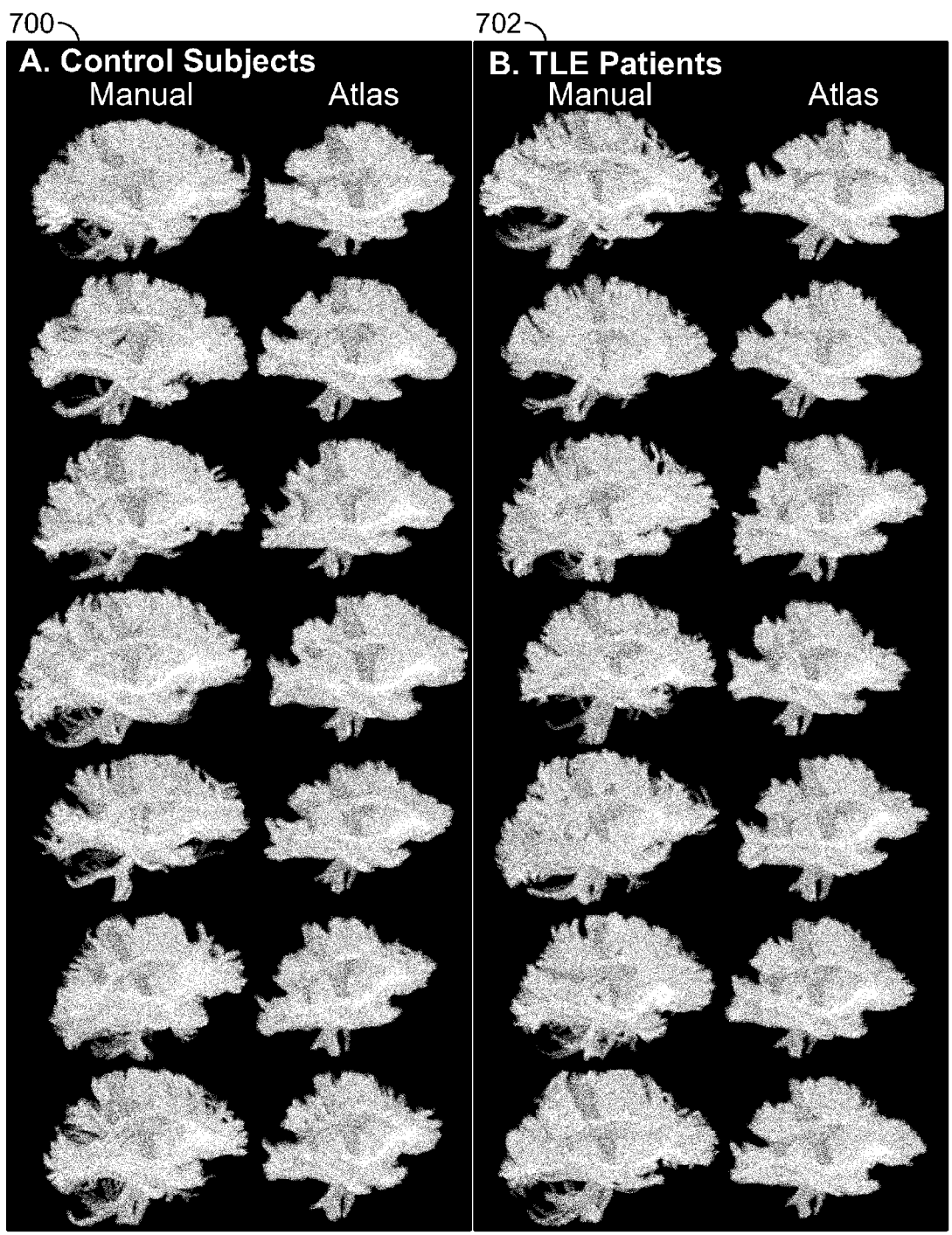
FIG. 7 is a diagram showing an example representation of fiber tracks for a nervous system.
Figure 8:
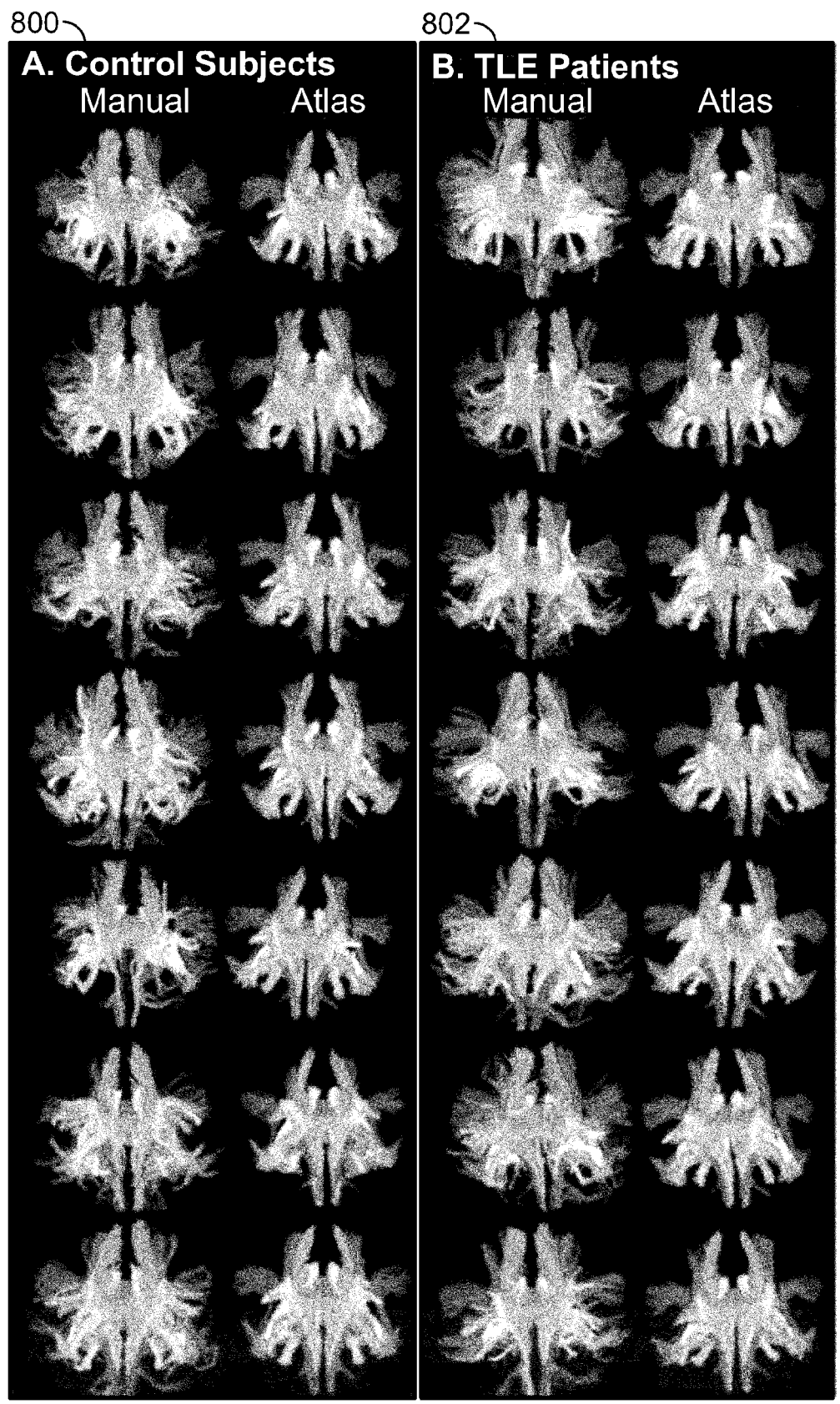
FIG. 8 is a diagram showing an example representation of fiber tracks for a nervous system.

FIG. 1 is a diagram 100 showing a comparison of example manually selected fiber tracks and example atlas-derived fiber tracks. Fiber tracks for one representative control subject are presented in the diagram 100. Example fiber tracks for additional subjects are shown in diagrams 700 and 702 of FIG. 7 and diagrams 800 and 802 of FIG. 8. In the example diagrams 100, 700, 702, 800, and 802, tracks for all fibers excluding forceps major and minor (subsets of corpus callosum) and tSLF (subset of SLF) are shown. The example atlas-derived fiber tracks shown were generated using FACT algorithm within fiber ROIs (relative fiber probability (RFP)>0.07, FA>0.15). In diagram 700 of FIG. 7, fiber tracks for seven representative control subjects are presented with an anterior, coronal view. In diagram 702 of FIG. 7, fiber tracks for seven TLE patients are presented with an anterior, coronal view. In diagram 800 of FIG. 8, fiber tracks for seven representative control subjects are presented with a right, sagittal view. In diagram 802 of FIG. 8, fiber tracks for seven TLE patients are presented with a right, sagittal view.

Figure 2:
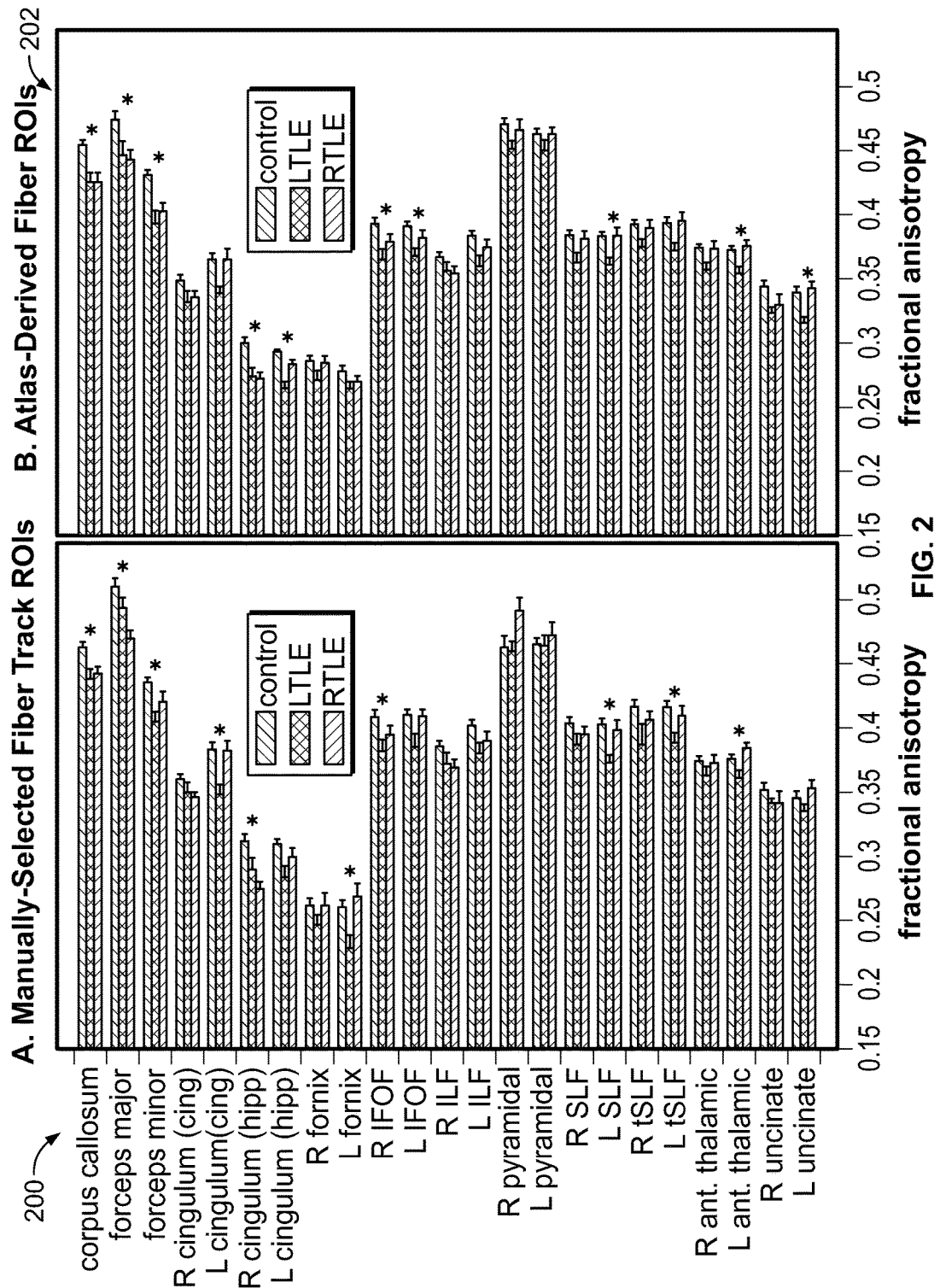
FIG. 2 is a diagram showing example fractional anisotropy data for a nervous system.

Average FA values were calculated for both the example manually selected fiber tracks and the example atlas-derived fiber ROIs. Coordinate axes 200 in FIG. 2 includes the weighted mean of fractional anisotropy of white matter in control subjects and right and left TLE patients for example manually-selected fiber tracks. Coordinate axes 202 in FIG. 2 includes the weighted mean of fractional anisotropy of white matter in control subjects and right and left TLE patients for example atlas-derived fiber ROIs. Error bars represent SEM. Voxels with FA less than 0.15 were excluded. In FIG. 2, fiber tracts with significant ($p<0.01$) group effects (ANOVA) are indicated with *. Table 600 of FIG. 6 includes ANOVA F-statistics from example manually selected and atlas-derived fibers for control subjects, left TLE patients, and right TLE patients. For each tract, a separate, one-way ANOVA was calculated across groups. Bold typeface in table 600 indicates $p<0.01$.

Figure 9:
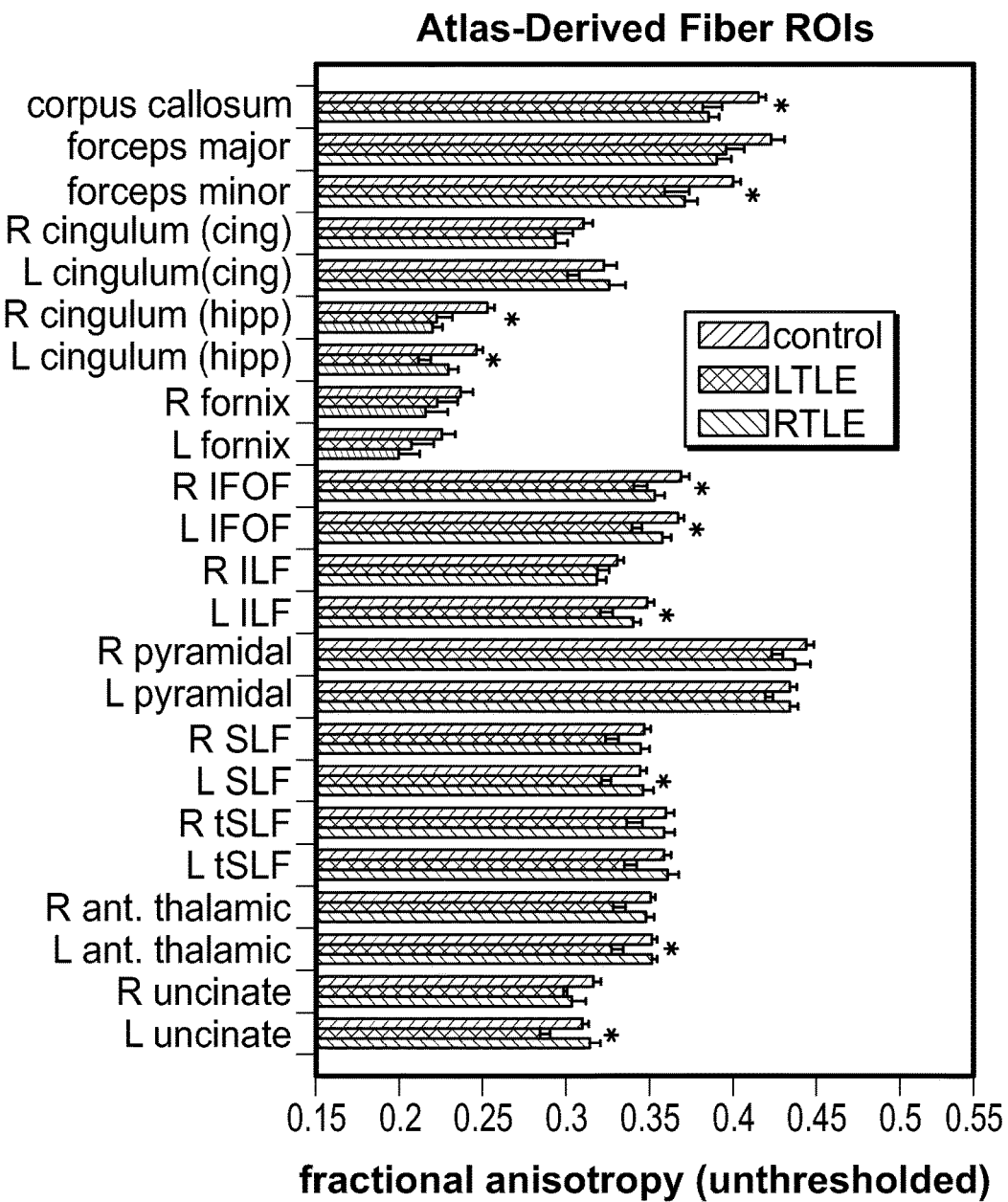
FIG. 9 is a diagram showing example fractional anisotropy data for a nervous system.

In the examples, the tractography technique used by DTI Studio exclude voxels from fiber tracks when the FA is lower than a threshold value such as 0.15. This same FA threshold was applied to the atlas-derived fiber ROIs. Average FA values were also calculated for atlas-derived fiber ROIs without FA thresholds. Coordinate axes 900 of FIG. 9 includes the weighted mean of fractional anisotropy of white matter in control subjects and right and left TLE patients for example atlas-derived fiber ROIs. Error bars represent SEM. Unlike the data shown in coordinate axes 202 of FIG. 2, no FA threshold was used to generate the data shown in coordinate axes 900 of FIG. 9. In FIG. 9, fiber tracts with significant ($p<0.01$) group effects (ANOVA) are indicated with *.

In the example data, the average FA values—calculated separately for control subjects and left and right TLE patients—for manually selected fiber tracks and atlas-derived fiber ROIs were highly correlated ($R^2=0.98$ with FA threshold, $R^2=0.97$ without threshold). Average FA values for atlas-derived fiber values were slightly lower than for manually selected fiber tracks (normalized difference averaged across fibers: $3.1\pm0.8\%$ SEM; t-test $p<10^{-3}$). When the FA threshold was not applied to the atlas-derived fiber ROIs, the average FA measures were further reduced relative to manually selected fiber tracks (normalized difference averaged across fibers: $13.1\pm1.0\%$ SEM; t-test $p<10^{-11}$). The average coefficient of variation (standard deviation/mean) across all fiber tracts was slightly lower for atlas-derived fiber ROIs ($5.9\pm0.2\%$ SEM) versus manually selected fiber tracks ($6.6\pm0.4\%$ SEM) ($p<0.05$, paired t-test).

In the example data, manually selected fiber tracks revealed differences between control and right and left TLE patients (one-way ANOVA across the three groups for each fiber tract), and a similar pattern of results was observed with the atlas-derived fiber ROIs. For example, see the coordinate axes 200 of FIG. 2, the table 600 of FIG. 6, table 1100 of FIG. 11, table 1200 of FIG. 12, and table 1300 of FIG. 13. Table 1100 of FIG. 11 includes the mean FA (±standard deviation) for each group for example manually selected fiber tracks (with FA threshold=0.15). The values in table 1100 are based on the same data as the information plotted in the coordinate axes 200 of FIG. 2. Table 1200 of FIG. 12 includes the mean FA (±standard deviation) for each group for atlas-derived fiber ROIs (with FA threshold=0.15). The values in table 1200 are based on the same data as the information plotted in the coordinate axes 202 of FIG. 2. Table 1300 of FIG. 13 includes the mean FA (±standard deviation) for each group for atlas-derived fiber ROIs (without FA threshold). The values in table 1300 are based on the same data as the information plotted in the coordinate axes 900 of FIG. 9

In the example data, there was an overall trend that TLE patients, particularly those with a left hemisphere epileptic focus, exhibited widespread, bilateral decreases in FA across fiber tracts relative to controls. Inspection of the table 600 of FIG. 6 reveals that parametric tests of group differences (i.e., ANOVAs) were generally associated with higher levels of statistical significance (i.e., lower p-values) for atlas-derived fiber ROIs compared to manually selected fiber tracks. To identify tracts with significant group effects, a threshold of $p<0.01$ was chosen, which was estimated to result in a false discovery rate (FDR) of less than 0.03. That is, out of 100 positive results, less than 3 are expected to be false.

In the example study, the atlas includes both location and orientation information for individual fiber tracts. To obtain fiber probability maps based on location alone, $T_1$-weighted MR images were sufficient for nonlinear registration with the atlas. The inclusion of diffusion imaging data refines the maps and individualizes them for each subject. This refinement can be important in resolving ambiguity between proximal fibers with different orientations. FIG. 3 includes six diagrams 300, 302, 304, 306, 308, and 310 that collectively illustrate refinement of atlas-derived fiber ROIs with orientation information. In the diagrams shown in FIG. 3, diffusion orientations of voxels within fiber ROIs are plotted as line segments, overlayed on an axial slice of the FA volume for a control subject. Diagram 300 of FIG. 3 shows example atlas-derived fiber ROI (RFP>0.07, FA>0.15) for corpus callosum, shown in the full slice, with yellow rectangle marking the region shown in diagrams 302, 304, 306, 308, and 310. Diagram 302 shows example manually selected fiber track ROI (voxels with at least one streamline). Diagram 304 shows atlas-derived fiber ROI (same as in diagram 300). Diagram 306 shows atlas-derived fiber ROI, using location information only (RFP>0.10, FA>0.15). Diagram 308 shows corpus callosum fiber orientations from the example atlas for all voxels with RFP>0; diagram 308 does not show individual subject data, in contrast to diagrams 300, 302, 304, 306, and 310 which do show individual subject data. Diagram 310 shows atlas-derived fiber ROIs for left and right cingulum bundles. Because two fiber tracts such as the corpus callosum and cingulum are close to each other, the location probability maps overlap. The local orientations of these fiber tracts are roughly perpendicular to each other, which makes it possible to distinguish the two fiber tracts based on the fiber orientation atlas.

In the examples, the orientation information used in the atlas is first filtered by local neighborhood smoothing in individual subjects. For example, see FIG. 4. When two or more fibers occupy a single voxel, the estimated orientation may be dominated more by one fiber than the other, or may be more or less random. Furthermore, streamline fiber tracks may sometimes stray slightly into neighboring tracts. With orientation smoothing, the orientations are forced to be consistent with the overall trajectory of the fiber tract of interest, making it possible to distinguish between neighboring fiber tracts like the corpus callosum and cingulum. For example, see FIG. 3.

The described probabilistic atlas-based technique can enable fully automated identification of several major fiber tracts in individual subjects. This technique has been applied in example implementations to the study of temporal lobe epilepsy, comparing control subjects to left and right TLE patients. Other potential applications include studies of different patient populations, as well as studies of normal development and aging. The described technique does not require human intervention. Thus, large-scale studies of white matter fiber tracts can be made more practical and efficient and reduce or remove concern about potential inter-operator variability. In contrast to automated segmentation of subcortical structures using $T_1$-weighted images, white matter fiber tract assignments are not mutually exclusive like the subcortical structure labels. That is to say, two or more fiber tracts may occupy the same voxel. The fiber atlas used in example implementations was constructed in $T_1$-weighted space such that the fiber ROIs can be created in the same space as subcortical and cortical ROIs. Together, these techniques can provide an approach for efficiently obtaining ROI measures of tissue properties such as FA, ADC, $T_1$, etc. for both subcortical structures and white matter fibers tracts.

In the example studies, effect sizes for between-group comparisons—and thus statistical power—were, in general, as large or larger for atlas-derived fiber ROIs compared to manually selected fiber tracks. Because of the strong location and direction priors introduced by the probabilistic atlas, this technique may be less susceptible to noise in the diffusion imaging data than the more commonly used streamlining techniques. Stray tracks following routes that do not conform to the known anatomy of particular tracts may be produced with fiber tracking, but will contribute minimally to the atlas-derived fiber ROIs. Regions with low FA (e.g. lesions) or crossing fibers can interfere with fiber tracking, but may not prevent the probabilistic atlas technique from identifying those other parts of the fiber tract that are consistent with the atlas. The extensive manual editing involved in generating the fiber tracks was used to achieve a probabilistic atlas that accurately reflects white matter anatomy, but no manual editing is required when applying the atlas to new data. Subject populations other than healthy adults and TLE patients may exhibit somewhat different white matter tract trajectories, so application to other populations, such as children, may utilize adding to the atlas manually selected fiber tracks from a sample of that target population before successful application of this technique.

In the results of the example studies, there is a pronounced qualitative difference between manually selected fiber tracks and those selected using atlas-derived fiber masks. For example, see FIG. 1. In some implementations, the prior information supplied by the atlas eliminates the stray fibers that are difficult to avoid with manually selected fiber tracks, making extensive and time-consuming manual editing unnecessary. Despite the qualitative differences, the average measures of FA for atlas-derived and manually selected fibers were highly correlated in the example data. Between group comparisons of control subjects and TLE patients were also similar for both manually selected fiber tracks and atlas-derived fiber ROIs in the example data. Differences between the two sets of results may be attributable to deviations from true anatomy in the manually selected fiber tracks. The variability of FA measurements, as quantified by the coefficient of variation, was slightly decreased for atlas-derived fiber ROIs in the example data. Mean FA was generally lower for atlas-derived fiber ROIs in the example data, which could reflect a greater proportion of gray matter in the atlas-derived fiber ROIs, or could reflect the FA threshold used in the streamline fiber tracking technique. Application of an FA threshold to the atlas-derived fiber ROIs greatly reduced the difference in mean FA between manually selected and atlas-derived fibers in the example data, but did not substantially change the results of the group analysis.

Example manually selected fiber tracks and example atlas-derived fiber ROIs were used to compare control subjects and TLE patients. A general trend common to the results from both techniques was that several fibers showed lower FA in left TLE patients, regardless of hemisphere. This is consistent with some evidence of greater bilateral hippocampal and cortical pathology in patients with left compared to right TLE. Although the reason for greater brain pathology in left TLE is unclear, it has been proposed that left and right TLE are distinct diseases that have different effects on brain structure. The results of the example studies suggest that the greater deficits observed in patients with left TILE extend to discrete white matter tracts.

The described technique may include the use of fiber orientation information from diffusion imaging to refine the fiber probability estimates. This approach can individualize the fiber ROIs for each subject and minimize the contribution from regions that exhibit diffusion orientations inconsistent with the consensus fiber orientation information contained in the orientation atlas. Nonlinear registration may provide better alignment between subjects and atlas than that provided by affine registration. In some implementations, a robust correction of $B_0$ distortion, providing excellent registration between diffusion images and the TI-weighted structural images was used to register to atlas space. The described techniques can be implemented without streamline tractography, which may reduce errors such as stray fibers due to noise in the diffusion-weighted MRI images. The described techniques for generating fiber ROIs for new subjects does not require generating streamlines for each subject. This distinction can be important in the case of fiber tracts that happen to be interrupted by a lesion, a situation easily handled by a voxel-wise, probabilistic atlas-based technique, but typically not by streamline fiber tracking.

In some cases, artifactual tracks between unconnected cortical parcels can be generated, requiring careful comparison with known anatomy to distinguish the real from artifactual tracks. Moreover, even though two cortical parcels may in fact have connections, streamlines connecting them may follow alternative, artifactual routes. Some manual editing of fiber tracks for single subjects could be utilized to reduce this effect. Once edited, fiber tracks that accurately model known fiber trajectories between two cortical parcels could be included in a probabilistic atlas such as the described example atlas, reducing or eliminating future reliance on streamline fiber tracking in single subjects.

The atlas-based fiber identification technique can be used in a variety of research and clinical settings. In some implementations, the technique relies on accurate registration of individual subjects to atlas space using $T_1$-weighted images. Compared to diffusion weighted images, $T_1$-weighted images are typically acquired at high resolution (e.g. ~1 mm isotropic) and have high SNR, allowing for robust registration to atlas space. The discrete cosine transform (DCT) technique was used in the described example studies for nonlinear registration, but registration techniques with more degrees of freedom, or including diffusion tensor data, could improve the correspondence of fiber tract locations between subjects. A second feature that can be included in some implementations of the described technique is to use more parameters to represent the diffusion orientations than the six used by diffusion tensors. Such representations may allow for more accurate estimation of the fractional volume occupied by two or more fibers within a single voxel. Third, the technique could, in some implementations, take advantage of information about the relative spatial arrangement of neighboring fiber tracts. Markov Random Fields could be used to encode the conditional probabilities of neighboring tracts, similar to the technique used for the refinement of subcortical segmentations. Finally, the accuracy of the fiber ROIs may depend on the quality of the atlas. Stray fibers in the manually selected fiber tracks used to construct the atlas contribute to some degree to the atlas-derived fiber ROIs. This contribution could be reduced or eliminated, for example, with manual editing to trim away the portions of streamlines that stray from the expected route.

The described example atlas contains many major fiber tracts in the human brain. Additional, minor tracts could be added to the atlas, and other tracts, such as corpus callosum, could be further subdivided. Some fiber tracts, such as the optic radiations from LGN to V1 (e.g. Meyer's Loop) were difficult to reconstruct reliably in every subject with the deterministic tracking technique used in the described example. Probabilistic fiber tracking techniques, particularly those that explicitly deal with crossing fibers, may be better able to reconstruct these tracts, although manual selection of fiber tracks following the correct path and exclusion of fibers following alternate routes may remain useful. If a known tract can be reliably reconstructed with either probabilistic or deterministic fiber tracking, it can be added to the probabilistic fiber atlas.

Figure 14:
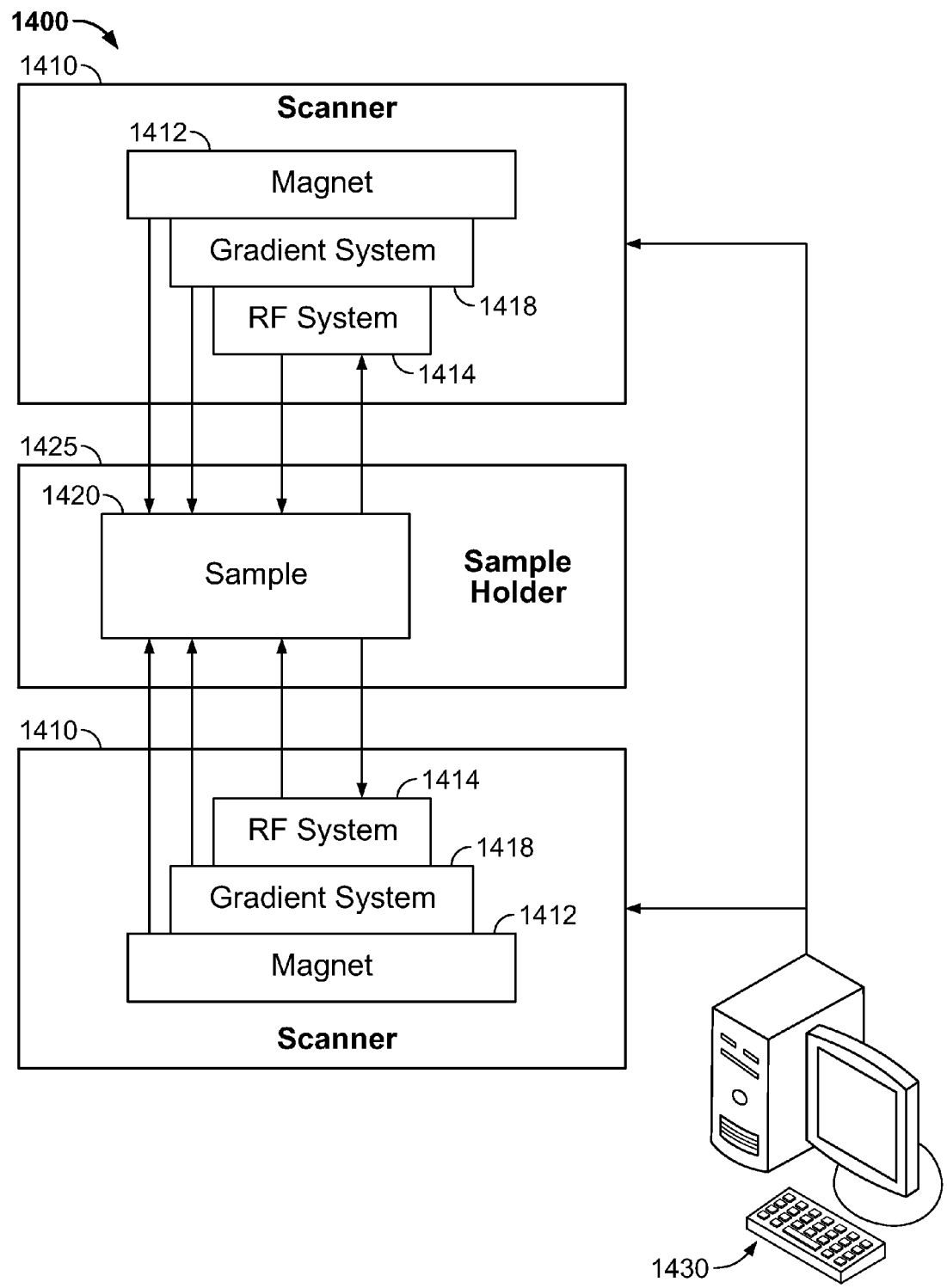
FIG. 14 is a diagram showing an example system for implementing magnetic resonance imaging techniques.

Some aspects of the techniques and functional operations described in this specification can be implemented using an MRI system. FIG. 14 is a block diagram showing an example system 1400 for implementing MRI techniques. The system 1400 can be used to acquire magnetic resonance signals (e.g., a free induction decay signal, an echo signal, and/or others). The signals can be used to generate images of a subject of an MRI scan. For example, the acquired signals can be used to generate a $T_1$-weighted image, a $T_2$-weighted image, a diffusion-weighted image, and/or other types of images. The MRI system 1400 can be implemented using custom-built and/or commercially available hardware and/or software. Examples of commercially available MRI scanners include a General Electric 1.5T EXCITE HD scanner with an 8-channel phased-array head coil, and/or others.

The MRI system 1400 includes a scanner 1410, a data processing apparatus 1430 and a sample (or subject) holder or table 1425 for holding a sample (or subject) 1420. The scanner 1410 includes a main magnet 1412, a gradient system 1418 and an rf system 1414. The main magnet 1412 is designed to provide a substantially constant, homogeneous magnetic field (e.g., 1.5 Tesla, 3 Tesla, or a different field strength). For example, the main magnet 1412 can be implemented as an electromagnet, a superconducting magnet, or another type of magnetic.

The gradient system 1418 may include multiple gradient coils designed to provide magnetic field gradients (e.g., gradients along axes defined by a Cartesian geometry, a polar geometry, or a different geometry). The gradient system 1418 can select for acquisition signals generated by a desired slice. The gradient system 1418 can select for acquisition signal components corresponding to radial trajectories through a spatial frequency domain (i.e., k-space) of the sample 1420. The gradient system 1418 can generate a phase encoding and/or slice-selecting magnetic field. The gradient system 1418 can further include components such as gradient amplifier (not shown), and various other hardware components.

The rf system 1414 may include an rf transmit coil and a separate rf receive coil designed to separately transmit and receive rf pulses. Alternatively, the rf system 1414 may include an rf transceiver that has a single rf coil for receiving and for transmitting rf signals. For example, a close-fitting smaller coil may improve image quality when a small region is being imaged. In some cases, depending of the sample and/or the particular imaging application, various types of coils can be placed around specific parts of a body (e.g., the head, knee, wrist, etc.) or even internally. For example, the rf system 1414 can include an 8-channel phased-array head coil, or a different type of head coil, for acquiring images of at least a portion of a nervous system. The rf system 1414 can further include components such as an rf synthesizer (not shown), a power amplifier (not shown), and various other hardware components.

The data processing apparatus 1430 is designed to receive and process acquired data to obtain desired images and information. For example, the data processing apparatus 1430 can be implemented as a computer or as various computing components (e.g., servers, routers, workstations, and/or software components) in a distributed computing environment. For example, the data processing apparatus 1430 can generate images of the sample 1420 and/or other types of data based on acquired magnetic resonance signals, perform signal processing operations such as a discrete Fourier transform and/or other operations, and/or perform one or more of the operations of the process 1500 of FIG. 15. In some cases, the data processing apparatus 1430 includes remote systems for data processing. For example, in some cases, data is transferred to a remote Linux system (or another type of system) for data analysis.

In one aspect of operation, the sample 1420 is subject to the external magnetic field generated by the magnet 1412. In response to the external magnetic field, a portion of the nuclear spins in the sample 1420 are polarized along an axis defined by the external magnetic field, and the sample acquires a bulk magnetic moment along the axis. The rf system 1414 and/or the gradient system 1418 manipulate the nuclear spins, for example, according to a pulse sequence that includes multiple radio frequency (rf) pulses, delays, and/or magnetic field gradients. The rf system 1414 acquires a signal generated by the nuclear spins in the sample 1420 in response to the pulse sequence. The data processing apparatus 1430 receives the acquired signals and generates images and/or other types of data based on the signals.

Figure 15:
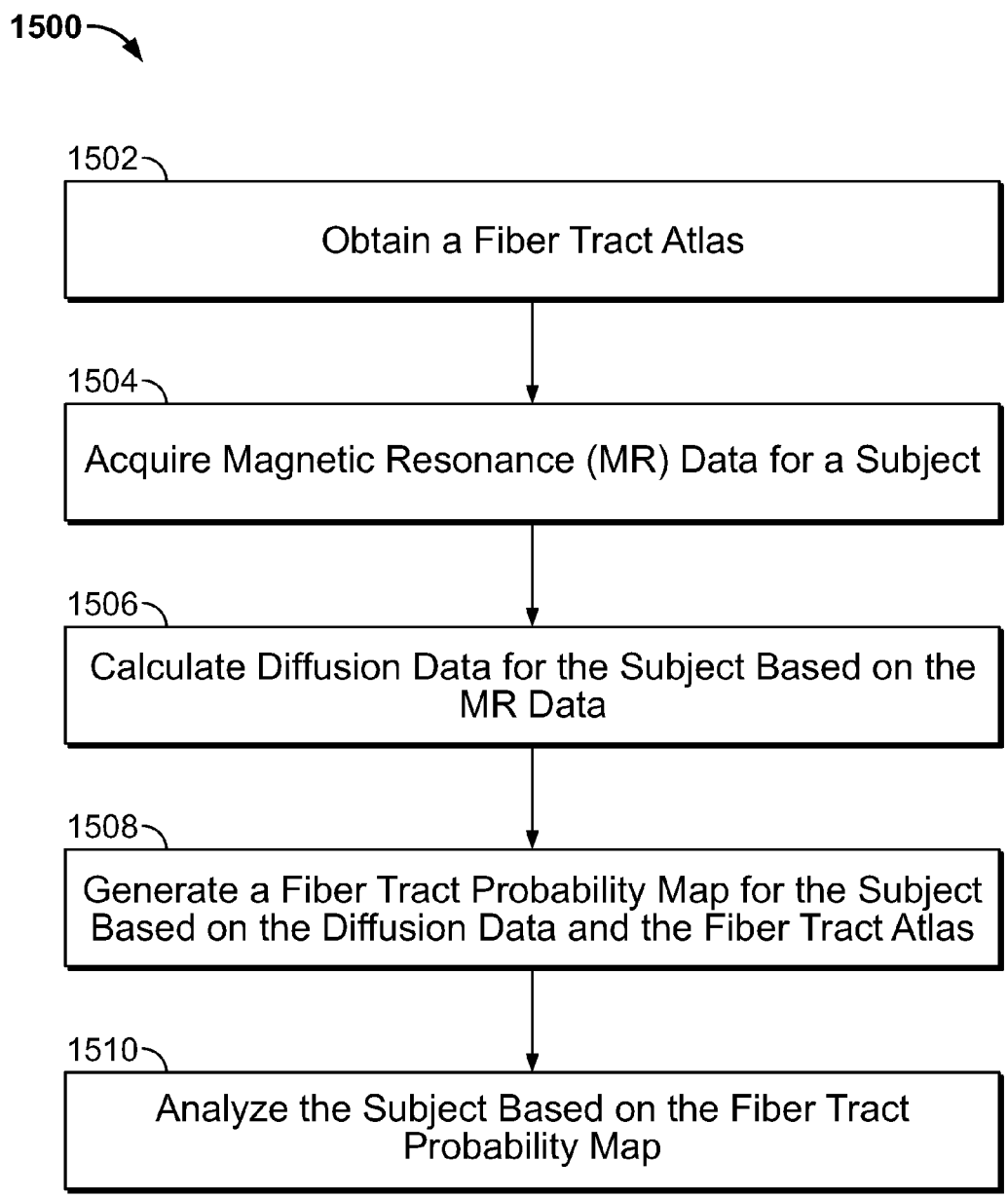
FIG. 15 is a flow chart showing an example technique for identifying fiber tracts.

FIG. 15 is a flow chart showing an example process 1500 for identifying fiber tracts based on magnetic resonance. For example, the process 1500 can be used to identify fiber tracks in the nervous system of a human, or in another type of biological system. The process 1500 can be used to implement some aspects of the example study described herein. In some examples, one or more operations of the process 1500 are implemented differently than they were implemented in the example study described herein. The process 1500 can include fewer, additional, and/or different operations than the described examples. The process 1500 can be used to generate data having aspects similar to some or all of the data shown in FIGS. 1-4 and 6-13.

At 1502, a fiber tract atlas is obtained. The fiber tract atlas can be obtained, for example, by receiving the fiber tract atlas over a network, by reading the fiber tract atlas from a memory of a computer and/or from another type of storage medium. The fiber tract atlas can be obtained by constructing the fiber tract atlas as described above, or by another technique. For example, the fiber tract atlas can be constructed by acquiring MR data from multiple different subjects, calculating diffusion data for each subject based on the MR data, and calculating an average diffusion tensor for each voxel of the fiber tract atlas by averaging the diffusion data across the additional subjects.

The fiber tract atlas can represent, for example, all or part of a human nervous system. As described above, the fiber tract atlas can include average location and orientation data for fiber tracts in a human brain. A fiber tract atlas can include multiple atlas voxels that collectively span the volume of the nervous system represented by the fiber tract atlas. For example, each atlas voxel can represent an identically-shaped, non-overlapping volume element of the nervous system. The volume elements can be arranged in a Cartesian coordinate system, a cylindrical coordinate system, a spherical coordinate system, or another type of geometric configuration. For each atlas voxel, the fiber tract atlas can include information that identifies an average range of fiber tract orientations in the volume element of the nervous system represented by the atlas voxel. For example, the fiber tract atlas can include one or more diffusion tensors for each atlas voxel. The diffusion tensor can be an average diffusion tensor based on measurements of diffusion data from multiple different subjects. The diffusion tensor can be a rank-two symmetric tensor. In some implementations, the orientations of fiber tracts can be represented by probability functions, matrices, and/or other types data structures. In some cases, the fiber tract atlas includes one or more values for each atlas voxel that can be used to construct a diffusion tensor for the atlas voxel. The fiber tract atlas can also include a location probability for each atlas voxel. The location probability can be an average relative probability that the atlas voxel contains a given fiber tract based, for example, on location alone (i.e., without regard to orientation).

The fiber tract orientation data for a given atlas voxel can represent a range of probable orientations of a given fiber tract in the atlas voxel. For example, a first diffusion tensor associated with an atlas voxel can represent orientations of a first type of fiber tract in the volume element represented by the atlas voxel, and a second diffusion tensor associated with the same atlas voxel can represent orientations of a second type of fiber tract in the volume element represented by the atlas voxel. Thus, for a given fiber tract orientation in a given atlas voxel, the fiber tract atlas can be used to calculate the relative probability, for each of multiple different fiber tracts, that the atlas voxel represents a given fiber tract. As such, when combined with diffusion data for a volume element of the nervous system for an individual subject, the fiber tract atlas can be used to construct a fiber tract probability map for the nervous system of the individual subject.

At 1504, magnetic resonance (MR) data is acquired for a subject. The MR data can be acquired, for example, by receiving the data over a network, by reading the data from a memory of a computer and/or from another type of storage medium. The MR data can be acquired by a diffusion tensor imaging protocol, which may include, for example, applying a plurality of radio frequency pulses to the subject, applying a plurality of gradient fields to the subject, and detecting echo signals from the subject. In various implementations, multiple different pulse sequences, gradient sequences, and/or acquisition schemes may be used for acquiring MR data that can be used to construct diffusion tensors for a subject. The MR data can include multiple data voxels that collectively span a region of the nervous system of the subject. For example, each data voxel can represent an identically-shaped, non-overlapping volume element of a human brain.

At 1506, diffusion data is calculated for the subject based on the acquired magnetic resonance data. The diffusion data can include a diffusion tensor, such as a rank two symmetric tensor, for each data voxel. The diffusion data can include a diffusion vector, such as a two-value or three-value vector that indicates a primary orientation of diffusion in a given data voxel. The vector can be an eigenvector of a diffusion tensor. For example, calculating the diffusion data can include calculating a diffusion tensor for each data voxel and identifying the eigenvectors and eigenvalues of each calculated diffusion tensor, and choosing the eigenvector associated with the largest eigenvalue. Other types of automated techniques may be used to identify a diffusion vector.

At 1508, a fiber tract probability map for the subject is generated based at least in part on the diffusion data and the fiber tract atlas. In some cases, calculating a fiber tract probability map includes identifying a spatial correspondence between one or more data voxels and one or more atlas voxels. Identifying a correspondence between the MR data for the subject and the fiber tract atlas may be performed by registering the acquired MR data to the fiber tract atlas. For example, identifying a correspondence between the MR data and the fiber tract atlas can include registering a $T_1$-weighted image to an atlas space of the fiber tract atlas and/or resampling the data voxels into the atlas space. Affine and/or non-linear registration techniques may be used.

In general, calculating a fiber tract probability map can include comparing diffusion data for a particular subject to the fiber tract atlas. In some implementations, calculating a fiber tract probability map can include using the fiber tract atlas to calculate a probability that a given data voxel represents (e.g., is a member of, corresponds to, and/or belongs to) the certain fiber tract, based at least in part on the calculated diffusion vector for the data voxel and an identification of orientations of the certain fiber tract in a region of the atlas. For example, if the fiber tract atlas includes an average diffusion tensor T that represents orientations of a certain fiber tract in a given volume element of the nervous system, and the calculated diffusion vector for a data voxel is v, calculating a probability that the data voxel represents the certain fiber tract can include combining T and v based on the example equation $$P = \frac{v'Tv}{\overline{v'Tv}}.$$

Other equations can be used to calculate the probability. Moreover, the calculation of the probability can be performed for multiple different fiber tracts at each voxel. Thus, the fiber tract probability map can include one or more probability values for each voxel, and each probability value can represent the relative probability that the voxel contains a particular fiber tract. The location probability for each voxel and/or the information on orientations of each fiber tract can be resampled from an atlas space to a subject space for the subject. As such, the calculated probability that a given data voxel represents the certain fiber tract can be based on the resampled location probability and the resampled orientation information. For example, in some cases the resampled location probability can be represented as P(f) in Equation (3) above.

At 1510, the subject is analyzed based at least in part on the fiber tract probability map. For example, the fiber tract probability map may be used to identify regions of interest of the nervous system, to calculate a fractional anisotropy for one or more fibers, to calculate a diffusivity for one or more fibers, to generate a fiber mask, and/or to perform other types of analysis. In some implementations, the analysis may be used to diagnose certain types of conditions, to evaluate the integrity of white matter in the brain, and/or for other types of clinical or diagnostic applications.

Some aspects of the techniques and functional operations described in this specification can be implemented in digital electronic circuitry, or in computer software, firmware, or hardware, including the structural means disclosed in this specification and structural equivalents thereof, or in combinations of them. Some aspects can be implemented as one or more computer program products, i.e., one or more computer programs tangibly embodied in an information carrier, e.g., in a machine readable storage device or in a propagated signal, for execution by, or to control the operation of, data processing apparatus, e.g., a programmable processor, a computer, or multiple computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

Some aspects of the processes and logic flows described in this specification can be performed by one or more programmable processors executing one or more computer programs to perform functions by operating on input data and generating output. Aspects of the processes and logic flows may be performed by, and apparatus can be implemented as, special purpose logic circuitry, e.g., an FPGA (field programmable gate array) or an ASIC (application specific integrated circuit).

Processors suitable for the execution of a computer program may include, by way of example, both general and special purpose microprocessors, and any one or more processors of any kind of digital computer. A processor typically receives instructions and data from a read-only memory or a random access memory or both. A computer includes a processor for executing instructions and one or more memory devices for storing instructions and data. A computer also typically includes, or is operatively coupled to receive data from or transfer data to, or both, one or more mass storage devices for storing data, e.g., magnetic, magneto optical disks, or optical disks. Devices suitable for embodying computer program instructions and data include all forms of non volatile memory, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user a computer may include a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The computing system can include clients and servers that interact through a communication network or another type of connection. The components of the system can be interconnected by any form or medium of digital data communication, e.g., a communication network. Examples of communication networks include a local area network ("LAN") and a wide area network ("WAN"), e.g., the Internet.

While this patent application contains many specifics, these should not be construed as limitations on the scope of an invention or of what may be claimed, but rather as descriptions of features specific to particular embodiments of the invention. Certain features that are described in this patent application in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. However, variations and enhancements of the described implementations and other implementations can be made based on what is described and illustrated in this patent application.

The invention claimed is:

1. A computer implemented method for determining how well magnetic resonance imaging data obtained from a subject corresponds to a given white matter fiber tract, the method comprising:

obtaining a fiber tract atlas for a nervous system, the fiber tract atlas comprising:
a plurality of atlas voxels that each represent a different volume element of the nervous system, the plurality of atlas voxels including a first atlas voxel that represents a first volume element of the nervous system, and
averaged information on probabilistic locations and orientations of a first fiber tract in the first volume element of the nervous system, wherein the averaged information on the probabilistic locations and the orientations of the first fiber tract includes a rank-two symmetric atlas diffusion tensor (T) having a first atlas diffusion tensor eigenvector ($\bar{v}$), such that $\bar{v}'T\bar{v}$ is equal to a largest eigenvalue of T;

acquiring magnetic resonance data from the nervous system of a subject, the magnetic resonance data comprising a plurality of data voxels including a first data voxel that relates to the first atlas voxel;

calculating a diffusion tensor for the first data voxel;

generating a diffusion vector (v) for the first data voxel, the diffusion vector being a first eigenvector corresponding to a largest eigenvalue of the calculated diffusion tensor for the first data voxel; and determining a probability P that the first data voxel of the magnetic resonance data of the subject corresponds to the first fiber tract, based at least in part on the generated diffusion vector (v) and the averaged information on the probabilistic locations and orientations of the first fiber tract in the first volume element, and without manual inspection of the generated diffusion vector, the orientation information, or magnetic resonance images associated with the magnetic resonance data, wherein the determined probability P is determined by combining the atlas diffusion tensor (T), the first atlas diffusion tensor eigenvector ($\bar{v}$), and the diffusion vector (v) of the first data voxel according to the expression $$\frac{v'Tv}{\bar{v}'T\bar{v}},$$

wherein v' is the transpose of v and $\bar{v}'$ is the transpose of $\bar{v}$.

2. The computer implemented method of claim 1, the method further comprising:

producing location information of a fiber tract of interest associated with the first data voxel using fiber density data, wherein the fiber density data is associated with the plurality of atlas voxels and includes streamline fiber counts to indicate a likelihood of an atlas voxel to the fiber tract of interest;

resampling the averaged information on the probabilistic locations and the orientations of the first fiber tract from an atlas space to a subject space for the subject, wherein the determined probability that the first data voxel corresponds to the first fiber tract is based in part on resampled location probability and resampled orientation information.

3. The computer implemented method of claim 1, wherein the nervous system includes a human nervous system, the determining the probability that the first data voxel corresponds to the first fiber tract is based at least in part on the generated diffusion vector and the fiber-specific average diffusion tensor based at least in part on measurements of a plurality of human nervous systems.

4. The computer implemented method of claim 1, wherein the averaged information on the probabilistic locations and the orientations of the first fiber tract comprises the first atlas diffusion tensor for the first atlas voxel, the fiber tract atlas further comprises an additional tensor for each other atlas voxel, the additional tensor for each other atlas voxel representing orientations of the first fiber tract in the atlas voxel, the method further comprising using the fiber tract atlas to determine an additional probability for each other data voxel, the additional probability for each other data voxel based at least in part on the generated diffusion vector for the data voxel and the additional tensor for an atlas voxel that relates to the data voxel, the additional probability for each other data voxel indicating a probability that the data voxel corresponds to the first fiber tract.

5. The computer implemented method of claim 1, further comprising determining that the first data voxel relates to the first atlas voxel by performing additional operations comprising:

registering a $T_1$-weighted image to an atlas space of the fiber tract atlas; and resampling the data voxels into the atlas space.

6. The computer implemented method of claim 1, wherein the averaged information on the probabilistic locations and the orientations of the first fiber tract comprises the first atlas diffusion tensor, and the obtaining the fiber tract atlas comprises obtaining a fiber tract atlas that further includes a plurality of additional tensors, each additional tensor representing the orientations of additional fiber tracts in the first volume element of the nervous system.

7. The computer implemented method of claim 6, wherein the probability that the first data voxel corresponds to the first fiber tract comprises a first probability, the method further comprising using the fiber tract atlas to determine a plurality of additional probabilities based at least in part on the generated diffusion vector and the plurality of additional tensors, each additional probability representing a relative probability that the first data voxel corresponds to one of the additional fiber tracts.

8. The computer implemented method of claim 1, further comprising constructing the obtained fiber tract atlas by performing additional operations comprising:
  acquiring additional magnetic resonance data from nervous systems of a plurality of additional subjects, the additional magnetic resonance data comprising a plurality of data voxels for each additional subject;
  generating an additional diffusion tensor for each data voxel of each additional subject based at least in part on the additional magnetic resonance data; and
  generating an average diffusion tensor for each atlas voxel of the fiber tract atlas by averaging the additional diffusion tensors across the additional subjects.

9. The computer implemented method of claim 1, wherein the generating the diffusion vector comprises generating an additional eigenvector (v) of a second diffusion tensor, the second diffusion tensor based at least in part on the acquired magnetic resonance data, and wherein the determining the probability comprises combining the rank-two symmetric tensor T, the eigenvector ($\bar{v}$), and the additional eigenvector v according to the expression $$\frac{v'\bar{T}v}{\bar{v}'\bar{T}\bar{v}}.$$

10. The computer implemented method of claim 1, further comprising:
  using the determined probability with the fiber tract atlas and the acquired magnetic resonance data to generate a fiber probability map for at least a first portion of the nervous system of the subject; and
  using the probability map to determine at least one of a fractional anisotropy for the first fiber tract or a diffusivity for the first fiber tract.

11. The method of claim 1, wherein acquiring magnetic resonance data comprises:
  applying a plurality of radio frequency pulses to the subject;
  applying a plurality of gradient fields to the subject; and
  detecting at least one echo signal from the subject.

12. A magnetic resonance imaging (MRI) system comprising:
  a magnetic resonance data acquisition system adapted to acquire magnetic resonance data from a nervous system of a subject, the magnetic resonance data comprising a plurality of data voxels including a first data voxel; and
  a data processor that is configured to:
    receive the magnetic resonance data from the magnetic resonance data acquisition system;
    obtain a fiber tract atlas for the nervous system from the magnetic resonance data, the fiber tract atlas comprising:
      a plurality of atlas voxels that each represent a different volume element of the nervous system, the plurality of atlas voxels including a first atlas voxel that represents a first volume element of the nervous system, the first data voxel relating to the first atlas voxel; and
      averaged information on probabilistic locations and orientations of a first fiber tract in the first volume element of the nervous system, wherein the averaged information on the probabilistic locations and the orientations of the first fiber tract includes a rank-two symmetric atlas diffusion tensor (T) having a first atlas diffusion tensor eigenvector ($\bar{v}$), such that $\bar{v}'\bar{T}\bar{v}$ is equal to the largest eigenvalue of T;
    calculate a diffusion tensor for the first data voxel;
    generate a diffusion vector (v) for the first data voxel, the diffusion vector being a first eigenvector corresponding to a largest eigenvalue of the calculated diffusion tensor for the first data voxel; and
    process the fiber tract atlas and magnetic resonance data to determine a probability P that the first data voxel corresponds to the first fiber tract, based at least in part on the generated diffusion vector (v) and the averaged information on the probabilistic locations and the orientations of the first fiber tract in the first volume element and without manual inspection of the generated diffusion vector, the orientation information, or magnetic resonance images associated with the magnetic resonance data, wherein the determined probability includes P is determined by combining the atlas diffusion tensor (T), the first atlas diffusion tensor eigenvector ($\bar{v}$), and the diffusion vector (v) of the first data voxel according to the expression $$\frac{v'\bar{T}v}{\bar{v}'\bar{T}\bar{v}},$$

wherein v' is the transpose of v and $\bar{v}'$ is the transpose of $\bar{v}$.

13. The MRI system of claim 12, the magnetic resonance data acquisition system comprising:
  a magnet that generates a substantially static principal magnetic field;
  a gradient sub-system that applies a plurality of gradient fields to the subject; and
  a radio frequency sub-system that applies a plurality of radio frequency pulses to the subject and detects at least one echo signal from the subject.

14. The MRI system of claim 13, wherein the radio frequency sub-system includes a head coil that acquires magnetic resonance data from a human nervous system.

15. The MRI system of claim 12, wherein the data processor is further configured to:
  process data corresponding to the determined probability and data corresponding to the fiber tract atlas and the acquired magnetic resonance data to generate a fiber probability map for at least a first portion of the nervous system of the subject; and
  use the probability map to identify a region of interest of the nervous system of the subject.

16. The MRI system of claim 12, further comprising a data communication network communicatively coupling the magnetic resonance data acquisition system and a computing device that includes the data processor.

17. A computer program product comprising a non-transitory computer-readable medium having code stored thereon, the code, when executed by a data processing apparatus, causing the data processing apparatus to implement a method comprising:
obtaining a fiber tract atlas for a nervous system, the fiber tract atlas comprising:
a plurality of atlas voxels that each represent a different volume element of the nervous system, the plurality of atlas voxels including a first atlas voxel that represents a first volume element of the nervous system, and
averaged information on probabilistic locations and orientations of a first fiber tract in the first volume element of the nervous system, wherein the averaged information on the probabilistic locations and the orientations of the first fiber tract includes a rank-two symmetric atlas diffusion tensor ($\bar{T}$) having a first atlas diffusion tensor eigenvector ($\bar{v}$), such that $\bar{v}'\bar{T}\bar{v}$ is equal to the largest eigenvalue of $\bar{T}$;
acquiring magnetic resonance data from the nervous system of a subject, the magnetic resonance data comprising a plurality of data voxels including a first data voxel, the first data voxel relating to the first atlas voxel;
calculating a diffusion tensor for the first data voxel;
generating a diffusion vector (v) for the first data voxel, the diffusion vector being a first eigenvector corresponding to a largest eigenvalue of the calculated diffusion tensor for the first data voxel; and
determining a probability P that the first data voxel of the magnetic resonance data of the subject corresponds to the first fiber tract, based at least in part on the generated diffusion vector (v) and the averaged information on the probabilistic locations and the orientations of the first fiber tract in the first volume element, and without manual inspection of the generated diffusion vector, the orientation information, or magnetic resonance images associated with the magnetic resonance data, wherein the determined probability includes P is determined by combining the atlas diffusion tensor ($\bar{T}$), the first atlas diffusion tensor eigenvector ($\bar{v}$), and the diffusion vector (v) of the first data voxel according to the expression $$\frac{v'\bar{T}v}{\bar{v}'\bar{T}\bar{v}},$$

wherein v' is the transpose of v and $\bar{v}'$ is the transpose of $\bar{v}$.

18. The computer program product of claim 17, the operations further comprising:
producing location information of a fiber tract of interest associated with the first data voxel using fiber density data, wherein the fiber density data is associated with the plurality of atlas voxels and includes streamline fiber counts to indicate a likelihood of an atlas voxel to the fiber tract of interest;
resampling the averaged information on the probabilistic locations and the orientations of the first fiber tract from an atlas space to a subject space for the subject, wherein the determined probability that the first data voxel corresponds to the first fiber tract is based in part on resampled location probability and resampled orientation information.

19. The computer program product of claim 17, the operations further comprising:
using the determined probability with the fiber tract atlas and the acquired magnetic resonance data to generate a fiber probability map for at least a first portion of the nervous system of the subject; and
using the probability map to determine at least one of a fractional anisotropy for the first fiber tract or a diffusivity for the first fiber tract.

20. The computer program product of claim 17, the averaged information on the probabilistic locations and the orientations of the first fiber tract comprising the first atlas diffusion tensor, and the fiber tract atlas further comprising a plurality of additional tensors representing orientations of additional fiber tracts in the first volume element of the nervous system.

21. The computer program product of claim 20, the probability that the first data voxel corresponds to the first fiber tract comprising a first probability, the operations further comprising using the fiber tract atlas to find a plurality of additional probabilities based at least in part on the generated diffusion vector and the plurality of additional tensors, each additional probability representing a relative probability that the first data voxel corresponds to one of the additional fiber tracts.

* * * * *